(12) United States Patent
Jeong

(10) Patent No.: US 11,917,781 B2
(45) Date of Patent: Feb. 27, 2024

(54) ELECTRONIC DEVICE INCLUDING TRAY

(71) Applicant: SAMSUNG ELECTRONICS CO., LTD., Suwon-si (KR)

(72) Inventor: Kiyeong Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/838,639

(22) Filed: Jun. 13, 2022

(65) Prior Publication Data

US 2023/0022238 A1 Jan. 26, 2023

Related U.S. Application Data

(63) Continuation of application No. PCT/KR2022/006854, filed on May 13, 2022.

(30) Foreign Application Priority Data

Jul. 15, 2021 (KR) ........................ 10-2021-0092767

(51) Int. Cl.
*H05K 5/02* (2006.01)
*H04B 1/3818* (2015.01)

(52) U.S. Cl.
CPC ......... *H05K 5/0295* (2013.01); *H04B 1/3818* (2015.01)

(58) Field of Classification Search
CPC ...................................................... H05K 7/00
See application file for complete search history.

(56) References Cited

U.S. PATENT DOCUMENTS

| | | |
|---|---|---|
| 6,347,142 B1 | 2/2002 | Bernadet |
| 9,954,328 B2 | 4/2018 | Motohashi et al. |
| 2016/0266619 A1* | 9/2016 | Heiskanen ............ G06F 1/1656 |
| 2018/0351300 A1* | 12/2018 | Zhu ........................ G06F 21/70 |

FOREIGN PATENT DOCUMENTS

| | | |
|---|---|---|
| CN | 109149178 | 1/2019 |
| JP | 3929052 | 6/2007 |
| JP | 5660089 | 1/2015 |
| KR | 10-1419702 | 7/2014 |
| KR | 10-1602729 | 3/2016 |
| KR | 10-2042082 | 11/2019 |

OTHER PUBLICATIONS

Search Report dated Jul. 26, 2022 in counterpart International Patent Application PCT/KR2022/006854.

* cited by examiner

*Primary Examiner* — Jerry Wu
(74) *Attorney, Agent, or Firm* — Nixon & Vanderhye P.C.

(57) ABSTRACT

Disclosed is an electronic device including a housing; a tray socket provided in the housing; a tray configured to be inserted into the tray socket along an insertion direction; and an ejector configured to be connected to the tray socket and configured to press and separate the tray in a separation direction opposite to the insertion direction. The tray includes a first body configured to detachably couple with the tray socket including a seating portion configured to accommodate and support an external part; a second body configured to slidably couple with the first body along the insertion direction; a tray cover configured to be connected to the first body and exposed to the outside based on a state in which the tray is inserted into the tray socket and in which a pin insertion hole configured to enable communication between the second body and the outside is formed.

20 Claims, 20 Drawing Sheets

ELECTRONIC DEVICE INCLUDING TRAY

CROSS-REFERENCE TO RELATED APPLICATIONS

This application is a continuation of International Application No. PCT/KR2022/006854 designating the United States, filed on May 13, 2022, in the Korean Intellectual Property Receiving Office and claiming priority to Korean Patent Application No. 10-2021-0092767, filed on Jul. 15, 2021, in the Korean Intellectual Property Office, the disclosures of which are incorporated by reference herein in their entireties.

BACKGROUND

1. Field

The disclosure relates to a tray device and an electronic device including the tray device.

2. Description of Related Art

An electronic device may optionally accommodate a detachable external part, for example, a card-like external part such as an external memory card, a subscriber identification module (SIM) card, and a user identity module (UIM) card. A user may combine or separate the electronic device and the external part if necessary.

Currently, to improve portability and convenience of a user with advancement in technology, there is a technical demand for slimness and lightness of an electronic device. Efforts have been made to simplify a structure of a tray device that couples with or separates from the electronic device by accommodating an external part and to reduce an area of the tray device in the electronic device.

An electronic device may optionally couple or separate an external part by including a tray device that includes a tray configured to support the external part and a tray socket configured to couple with the tray. Such a tray structure is designed to be exposed in appearance for easy access from a user or to easily replace an external part after removing a partial structure of the electronic device, such as a cover and a battery.

In a conventional tray and tray socket structure, a tray is separated by pressing an ejector by a user or through a tray extraction pin. To implement this structure, the electronic device needs to be formed in a structure for providing a tray socket and the ejector. In forming such a structure, it is necessary to maintain convenience of a user for attaching and detaching an external part and, at the same time, to minimize an area occupied by the structure.

SUMMARY

Embodiments of the disclosure provide an electronic device that includes a tray.

Embodiments of the disclosure provide a tray that may reduce an internal occupation space of an electronic device through a double sliding method.

An electronic device according to various example embodiments may include: a housing, a tray socket provided in the housing, a tray configured to insert into the tray socket along an insertion direction, and an ejector configured to connect to the tray socket and to press and separate the tray in a separation direction opposite to the insertion direction. The tray may include: a first body including a seating portion for accommodating and supporting an external part and configured to detachably couple with the tray socket, a second body configured to slidably couple with the first body along the insertion direction, a tray cover configured to connect to the first body to be exposed to the outside based on a state in which the tray is inserted into the tray socket and in which a pin insertion hole enabling communication between the second body and the outside is formed, and the second body may be configured to slidably operate in the insertion direction to press the ejector based on an external force being applied through the pin insertion hole.

According to various example embodiments, a tray device configured to couple with an electronic device may include: a tray, a tray socket configured to receive the tray along an insertion direction, an ejector configured to connect to the tray socket and to press and separate the tray in a separation direction opposite to the insertion direction. The tray may include: a first body including a seating portion accommodating and supporting an external part provided and configured to detachably couple with the tray socket, a second body configured to slidably couple with the first body along the insertion direction and to overlap at least a portion of the seating portion when viewed from a top surface of the first body, and a tray cover configured to connect to the first body to be exposed to the outside based on a state in which the tray is inserted into the tray socket and in which a pin insertion hole enabling communication between the second body and the outside is formed, and the second body may be configured to slidably operate in the insertion direction to press the ejector based on an external force being applied through the pin insertion hole.

A tray of an electronic device according to various example embodiments may include: a first body configured to accommodate an external part and a second body configured to slide through coupling with the first body. Through this, it is possible to minimize and/or reduce a space used for a detachable structure of the tray and to efficiently secure a space of the electronic device. Also, since a user may easily attach and detach an external part to and from the electronic device if necessary, user convenience may be improved.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
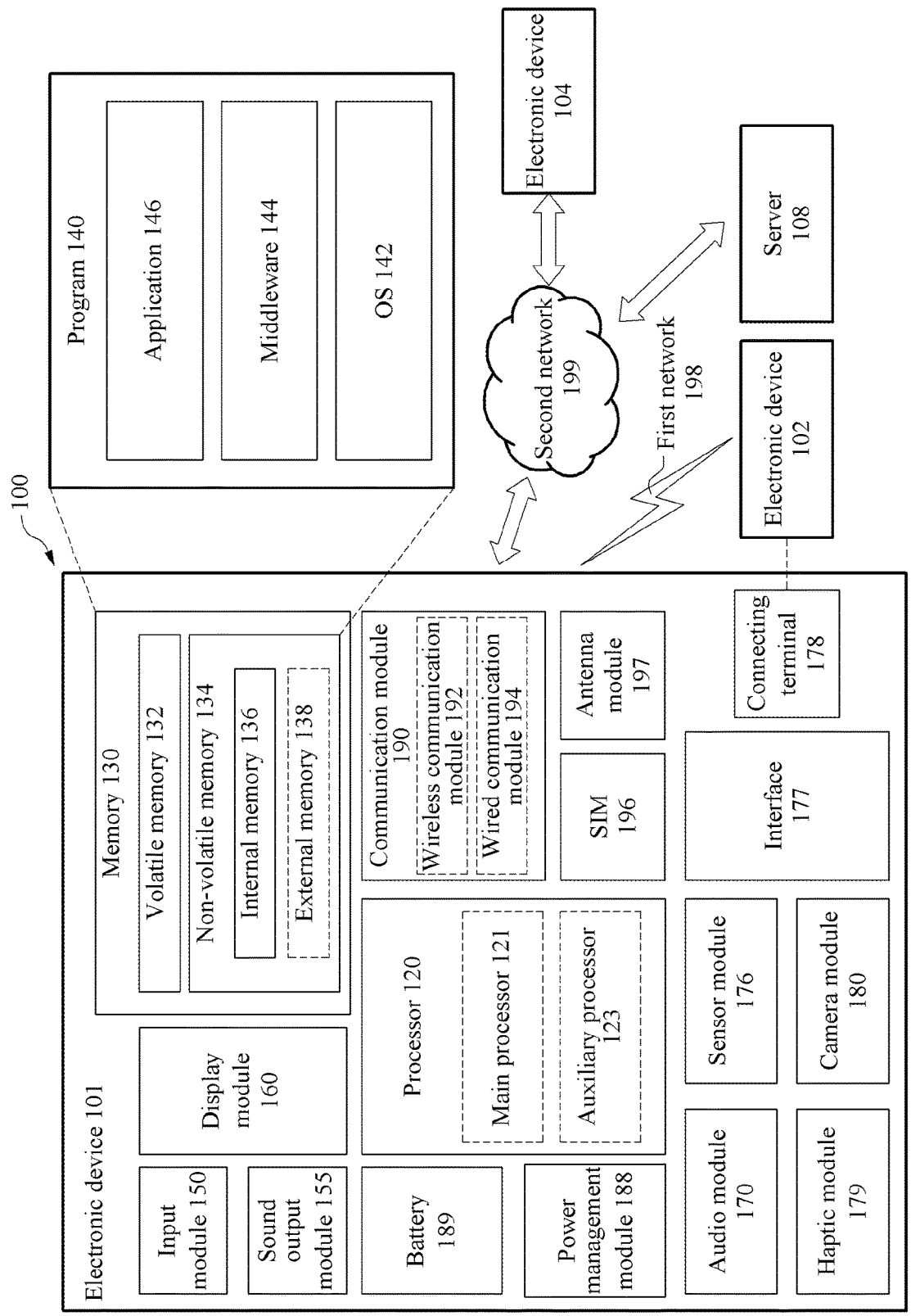
FIG. 1 is a block diagram illustrating an example electronic device in a network environment according to various embodiments.

Hereinafter, various example embodiments will be described in greater detail with reference to the accompanying drawings. When describing the example embodiments with reference to the accompanying drawings, like reference numerals refer to like elements and a repeated description related thereto may not be provided.

It should be appreciated that various example embodiments of the present disclosure and the terms used therein are not intended to limit the technological features set forth herein to particular example embodiments and include various changes, equivalents, or replacements for a corresponding example embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various example embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

Various example embodiments as set forth herein may be implemented as software (e.g., the program 140) including one or more instructions that are stored in a storage medium (e.g., an internal memory 136 or an external memory 138) that is readable by a machine (e.g., the electronic device 101) For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The "non-transitory" storage medium is a tangible device, and may not include a signal (e.g., an electromagnetic wave), but this term does not differentiate between where data is semi-permanently stored in the storage medium and where the data is temporarily stored in the storage medium.

According to an example embodiment, a method according to various example embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include any one or any combination of a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, and an antenna module 197. In various example embodiments, at least one (e.g., the connecting terminal 178) of the above components may be omitted from the electronic device 101, or one or more other components may be added in the electronic device 101. In various example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data obtained from another components (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence model processing. An artificial intelligence model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The artificial intelligence model may additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored as software in the memory 130, and may include, for example, an operating system (OS) 142, middleware 144, or an application 146.

The input module 150 may obtain a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to obtain an incoming call. According to an example embodiment, the receiver may be implemented separately from the speaker or as a part of the speaker.

The display module 160 may visually provide information to the outside (e.g., a user) of the electronic device 101 (e.g., a user). The display module 160 may include, for example, a control circuit for controlling a display, a hologram device, or a projector and control circuitry to control a corresponding one of the display, the hologram device, and the projector. According to an example embodiment, the display module 160 may include a touch sensor adapted to detect a touch, or a pressure sensor adapted to measure an intensity of a force incurred by the touch.

The audio module 170 may convert a sound into an electric signal or vice versa. According to an example embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, image signal processors, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or obtain a signal or power to or from the outside (e.g., the external electronic device) of the electronic device 101. According to an example embodiment, the antenna module 197 may include a slit antenna, and/or an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or obtained between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or obtained between the electronic device 101 and the external electronic device 104 via the server 108 coupled with the second network 199. Each of the external electronic devices 102 and 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various example embodiments may be one of various types of electronic devices. The electronic device may include, for example, a portable communication device (e.g., a smartphone), a computer device, a portable multimedia device, a portable medical device, a camera, a wearable device, or a home appliance device. According to an example embodiment of the disclosure, the electronic device is not limited to those described above.

Figure 2A:
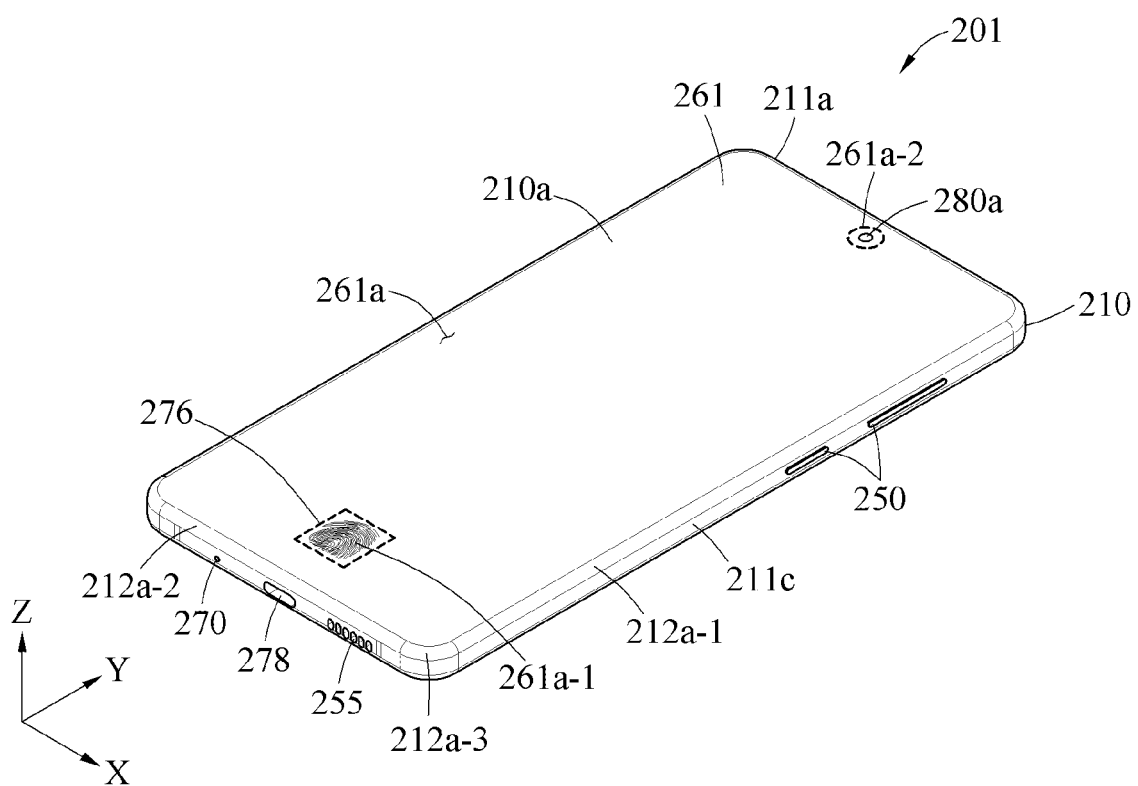
FIG. 2A is a front perspective view of an electronic device according to various embodiments.
Figure 2B:
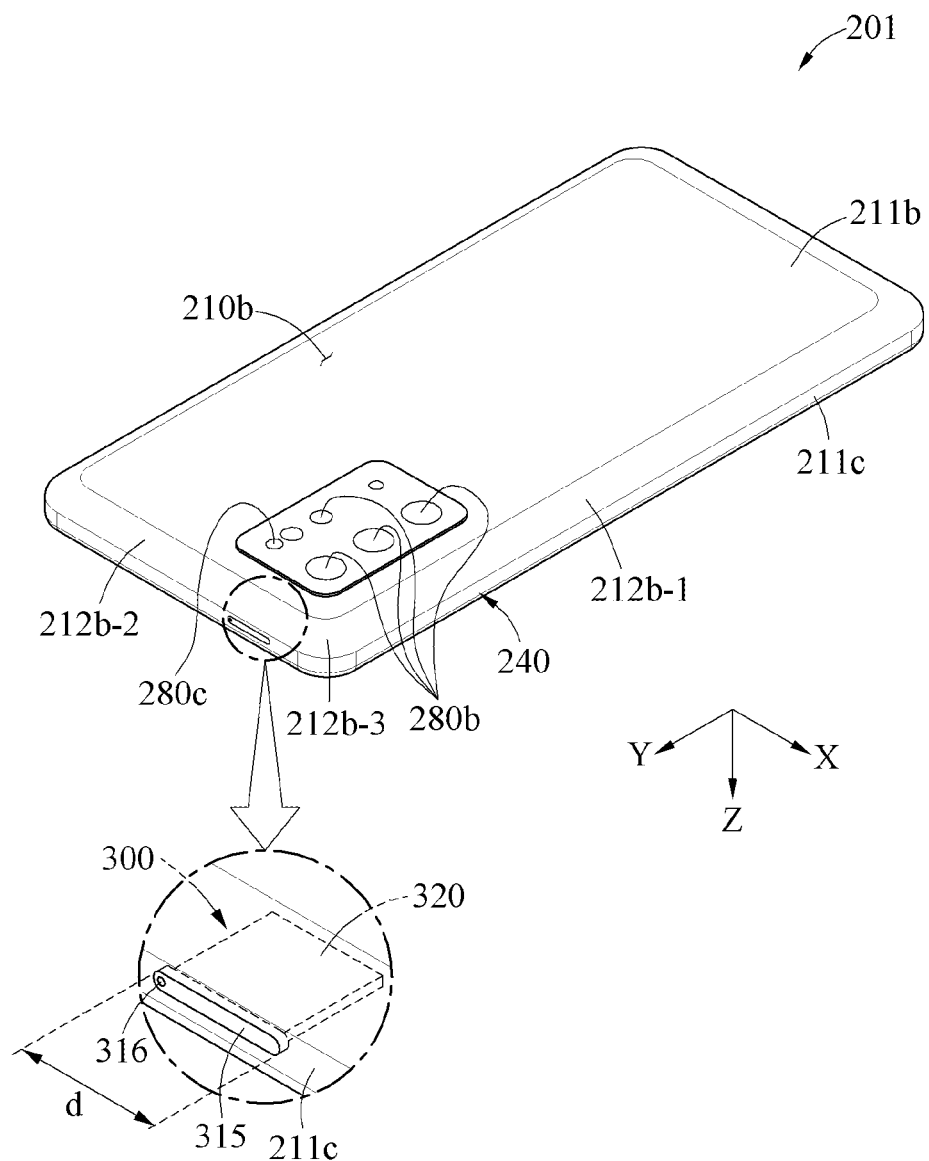
FIG. 2B is a rear perspective view of an electronic device according to various embodiments.
Figure 3:
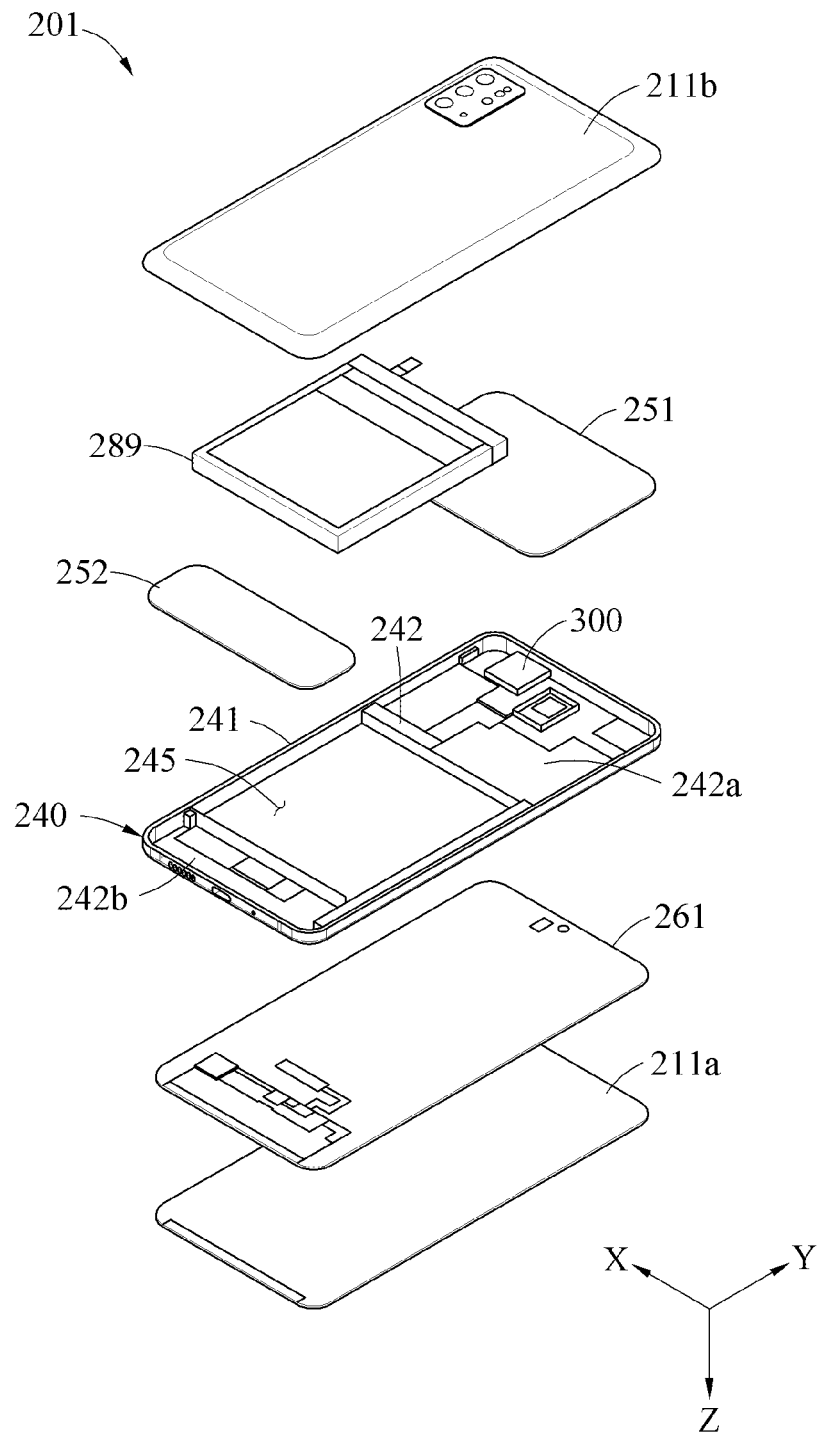
FIG. 3 is an exploded perspective view of an electronic device according to various embodiments.

FIG. 2A is a front perspective view of an electronic device 201 according to various embodiments, FIG. 2B is a rear perspective view of the electronic device 201 according to various embodiments, and FIG. 3 is an exploded perspective view of the electronic device 201 according to various embodiments.

Referring to FIGS. 2A, 2B, and FIG. 3, the electronic device 201 (e.g., the electronic device 101 of FIG. 1) according to an example embodiment may include a housing 210 configured to form an appearance and to internally accommodate a part. The housing 210 may include a front surface 210a (e.g., a first surface), a rear surface 210b (e.g., a second surface), and a side surface 211c (e.g., a third surface) that surrounds an internal space between the front surface 210a and the rear surface 210b.

In an example embodiment, the front surface 210a may be formed by a first plate 211a of which at least a portion is substantially transparent. For example, the first plate 211a may include a glass plate or a polymer plate that includes at least one coating layer. In an example embodiment, the rear surface 210b may be formed by a substantially opaque second plate 211b. For example, the second plate 211b may be formed of coated or tinted glass, ceramic, polymer, metal (e.g., aluminum, stainless steel, or magnesium), or a combination thereof. The side surface 211c may be formed by a side member 240 configured to couple with the first plate 211a and the second plate 211b and including a metal and/or a polymer. In an example embodiment, the second plate 211b and the side member 240 may be integrally and seamlessly formed. In an example embodiment, the second plate 211b and the side member 240 may be formed of substantially the same or similar material (e.g., aluminum).

In an example embodiment, the first plate 211a may include a plurality of first edge areas 212a-1 configured to be rounded from at least a portion of the front surface 210a toward the second plate 211b and extend in one direction (e.g., +/− axis direction), a plurality of second edge areas 212a-2 configured to be rounded from at least a portion of the front surface 210a toward the second plate 211b and extend in another direction (e.g., +/− Y-axis direction), and a plurality of third edge areas 212a-3 configured to be rounded from at least a portion of the front surface 210a toward the second plate 211b between the plurality of first edge areas 212a-1 and the plurality of second edge areas 212a-2.

In an example embodiment, the second plate 211b may include a plurality of fourth edge areas 212b-1 configured to be rounded from at least a portion of the rear surface 210b toward the first plate 211a and to extend in one direction (e.g., +/− X-axis direction), a plurality of fifth edge areas 212b-2 configured to be rounded from at least a portion of the rear surface 210b toward the first plate 211a and to extend in another direction (e.g., +/− Y-axis direction), and a plurality of sixth edge areas 212b-3 configured to be rounded from at least a portion of the rear surface 210b toward the first plate 211a between the plurality of fourth edge areas 212b-1 and the plurality of fifth edge areas 212b-2.

In an example embodiment, the side member 240 may surround at least a portion of an internal space between the front surface 210a and the rear surface 210b. The side member 240 may include a first support structure 241 provided on at least a portion of the side surface 211c and a second support structure 242 configured to connect to the first support structure 241 and to form an arrangement space of parts of the electronic device 201. In an example embodiment, the first support structure 241 may form the side surface 211c of the housing 210 by connecting edges of the first plate 211a and the second plate 211b and by surrounding a space between the first plate 211a and the second plate 211b. In an example embodiment, the second support structure 242 may be provided to the inside (or a body portion) of the electronic device 201. The second support structure 242 may be integrally formed with the first support structure 241 and may be separately formed and interconnected with the first support structure 241.

In an example embodiment, a printed circuit board (PCB) 251, 252 may be provided to the second support structure 242. The second support structure 242 may be connected to, for example, ground of the PCB 251, 252. In an example embodiment, a display 261 may be provided on one surface (e.g., a bottom surface (a surface in +Z-axis direction) of FIG. 3) of the second support structure 242 and the second plate 211b may be provided on another surface (e.g., a top surface (a surface in −Z-axis direction) of FIG. 3) of the second support structure 242.

In an example embodiment, at least a portion of the side member 240 may be formed of a conductive material. For example, the first support structure 241 may be formed of a metallic material and/or a conductive polymer material. In an example embodiment, similar to the first support structure 241, the second support structure 242 may be formed of a metallic material and/or a conductive polymer material.

In an example embodiment, the electronic device 201 may include the display 261 (e.g., the display module 160 of FIG. 1). In an example embodiment, the display 261 may be positioned on the front surface 210a. In an example embodiment, the display 261 may be exposed through at least a portion (e.g., the plurality of first edge areas 212a-1, the plurality of second edge areas 212a-2, and the plurality of third edge areas 212a-3) of the first plate 211a. In an example embodiment, the display 261 may comprise substantially the same or similar shape as an outer edge shape of the first plate 211a.

In an example embodiment, an edge of the display 261 may substantially match an outer edge of the first plate 211a. Although not illustrated, the display 261 of various example embodiments may include a touch sensing circuit, a pressure sensor (not shown) capable of sensing intensity (pressure) of a touch, and/or a digitizer (not shown) of detecting a magnetic field typed stylus pen (not shown).

In an example embodiment, the display 261 may include a screen display area 261a that is visually exposed and displays content through pixels or a plurality of cells. In an example embodiment, the screen display area 261a may include a sensing area 261a-1 and a camera area 261a-2. In this case, the sensing area 261a-1 may overlap at least a portion of the screen display area 261a. The sensing area 261a-1 may allow transmission of an input signal related to a sensor module 276 (e.g., the sensor module 176 of FIG. 1). The sensing area 261a-1 may display content, which is similar to the screen display area 261a that does not overlap the sensing area 261a-1.

For example, the sensing area 261a-1 may display content while the sensor module 276 is not operating. The camera area 261a-2 may overlap at least a portion of the screen display area 261a. The camera area 261a-2 may allow transmission of optical signals related to a first camera module 280a, 280b (e.g., the camera module 180 of FIG. 1). Similar to the screen display area 261a that does not overlap the camera area 261a-2, the camera area 261a-2 may display content. For example, the camera area 261a-2 may display content while the first camera module 280a, 280b is not operating.

In an example embodiment, the electronic device 201 may include an audio module 270 (e.g., the audio module 170 of FIG. 1). The audio module 270 may acquire sound from the outside of the electronic device 201. For example, the audio module 270 may be positioned on one surface of the housing 210, for example, the side surface 211c of the housing 210. In an example embodiment, the audio module 270 may acquire sound through at least one hole.

In an example embodiment, the electronic device 201 may include the sensor module 276. The sensor module 276 may detect a signal applied to the electronic device 201. The sensor module 276 may be positioned on, for example, the front surface 210a of the electronic device 201. The sensor module 276 may form the sensing area 261a-1 on at least a portion of the screen display area 261a. The sensor module 276 may obtain an input signal that passes through the sensing area 261a-1 and may generate an electrical signal based on the obtained input signal. For example, the input signal may comprise a specified physical quantity (e.g., heat, light, temperature, sound, pressure, and ultrasound). As another example, the input signal may include a signal related to biometric information of the user (e.g., a fingerprint and a voice of the user, etc.).

In an example embodiment, the electronic device 201 may include the camera module 280a, 280b (e.g., the camera module 180 of FIG. 1). In an example embodiment, the camera module 280a, 280b may include the first camera module 280a, a second camera module 280b, and a flash 280c. In an example embodiment, the first camera module 280a may be provided to be exposed through the front surface 210a of the housing 210, and the second camera module 280b and the flash 280c may be provided to be exposed through the rear surface 210b of the housing 210. In an example embodiment, at least a portion of the first camera module 280a may be provided to the housing 210 to be covered through the display 261. In an example embodiment, the first camera module 280a may obtain an optical signal that passes through the camera area 261a-2. In an example embodiment, the second camera module 280b may include a plurality of cameras (e.g., a dual camera, a triple camera, or a quad camera). In an example embodiment, the flash 280c may include light emitting diode or a xenon lamp.

In an example embodiment, the electronic device 201 may include a sound output module 255 (e.g., the sound output module 155 of FIG. 1). The sound output module 255 may output sound to the outside of the electronic device 201. For example, the sound output module 255 may output sound to the outside of the electronic device 201 through at least one hole formed in the side surface 211c of the housing 210.

In an example embodiment, the electronic device 201 may include an input module 250 (e.g., the input module 150 of FIG. 1). The input module 250 may obtain a manipulation signal of the user. The input module 250 may include, for example, at least one key input device that is provided to be exposed on the side surface 211c of the housing 210.

In an example embodiment, the electronic device 201 may include a connecting terminal 278 (e.g., the connecting terminal 178 of FIG. 1). In an example embodiment, the connecting terminal 278 may be provided on the outer peripheral surface of the housing 210, for example, the lower side surface 211c of the electronic device 201 as illustrated in FIG. 2A. While viewing the electronic device 201 in one direction (e.g., +Y-axis direction of FIG. 2A), the connecting terminal 278 may be provided in a central portion of the lower side surface 211c and the sound output module 255 may be provided in one direction (e.g., a right direction) based on the connecting terminal 278.

In an example embodiment, the electronic device 201 may include a tray device 300. In an example embodiment, the tray device 300 may include a tray 310 (see FIG. 4) including a tray cover 315 and a pin insertion hole 316 and a tray socket 320. Referring to FIG. 2B, by minimizing and/or reducing a length (d) occupied by the tray device 300 in the housing 210 or a length (d) required for the housing 210 of the electronic device 201 to accommodate the tray device 300, it is possible to secure an arrangement space of parts included in the electronic device 201 and to implement miniaturization and slimness of the electronic device 201. The tray device 300 and the electronic device 201 including the tray device 300 to implement the same are described in greater detail below with reference to FIG. 4.

In an example embodiment, the tray device 300 may be provided on the outer peripheral surface of the housing 210, for example, the upper side surface 211c of the electronic device 201 as illustrated in FIG. 2B. For example, while viewing the electronic device 201 in one direction (e.g., −Y-axis direction of FIG. 2B), the tray device 300 may be provided in the central portion of the upper side surface 211c or may be provided adjacent to or spaced apart from the central portion.

Referring to FIGS. 2A and 2B, the audio module 270, the sound output module 255, the connecting terminal 278, and the tray device 300 may be provided on the side surface 211c of the housing 210 that forms an appearance of the electronic device 201. However, actual implementation is not limited thereto. At least a portion thereof may be provided on the front surface 210a or the rear surface 210b of the housing 210, or may be provided in the housing 210. For example, although not illustrated, the housing 210 may include a cover (not shown) configured to replace a battery 289 and the tray device 300 may be positioned inside the cover (not shown). Therefore, if necessary, the user may separate the cover (not shown) of the electronic device 201 and then separate the tray 310 from the tray device 300.

In an example embodiment, the electronic device 201 may include the PCBs 251, 252 and the battery 289 (e.g., the battery 189 of FIG. 1). In an example embodiment, the PCB 251, 252 may include a first circuit board 251 and a second circuit board 252. The first circuit board 251 of an example embodiment may be accommodated in a first substrate slot 242a of the second support structure 242 and the second circuit board 252 may be accommodated in a second substrate slot 242b of the second support structure 242. In an example embodiment, the battery 289 may be accommodated in a battery slot 245 of the second support structure 242 formed between the first substrate slot 242a and the second substrate slot 242b.

In an example embodiment, a processor (e.g., the processor 120 of FIG. 1) may be provided to the PCB 251, 252. The processor may include, for example, a central process unit (CPU), an application processor (AP), an image signal processor, a sensor hub processor, and a communication processor. In an example embodiment, a wireless communication circuit (e.g., the wireless communication module 192 of FIG. 1) may be provided on the PCB 251, 252. The wireless communication circuit may communicate with, for example, an external device (e.g., the electronic device 104 of FIG. 1). The electronic device 201 may include an antenna (e.g., the antenna module 197 of FIG. 1) and the wireless communication circuit may be electrically connected to an antenna structure. In an example embodiment, the wireless communication circuit may generate a signal to be transmitted through the antenna structure or may detect a signal obtained through the antenna structure. In an example embodiment, the PCB 251, 252 may include the ground, and the ground of the PCB 251, 252 may function as ground in the antenna structure implemented using the wireless communication circuit.

Figure 4A:
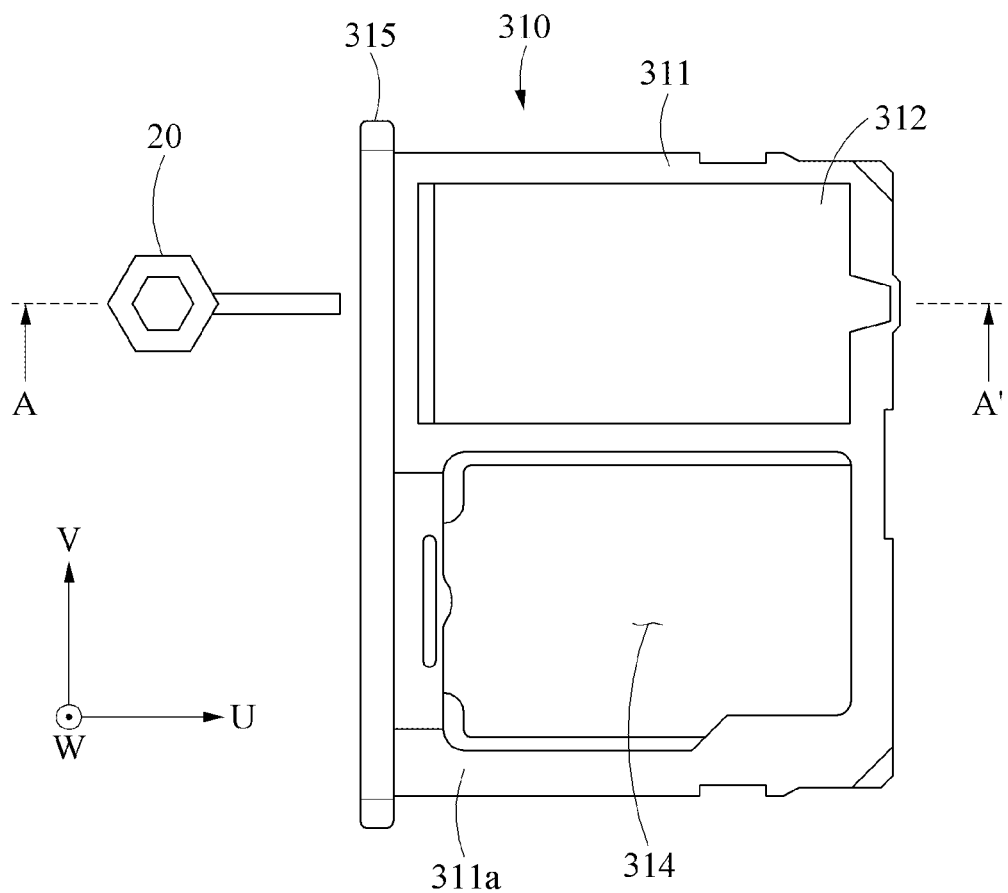
FIG. 4A is a diagram illustrating a top view of an example tray according to various embodiments.
Figure 4B:
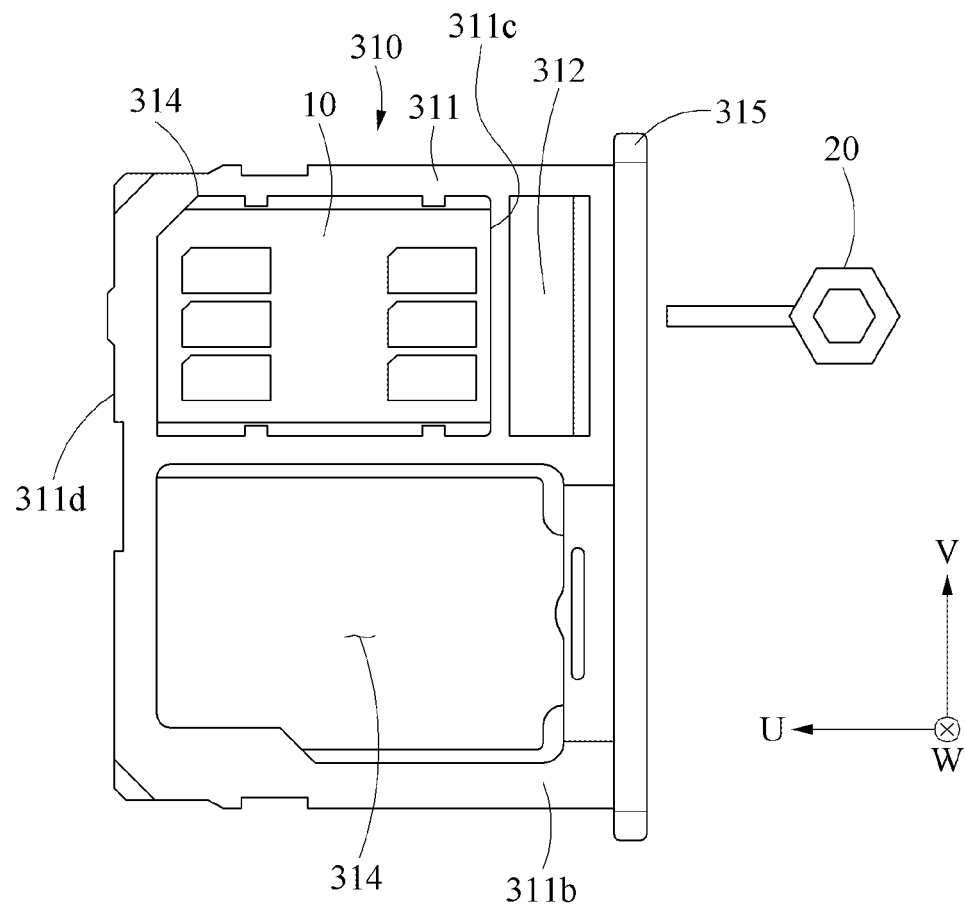
FIG. 4B is a diagram illustrating a bottom view of an example tray according to various embodiments.
Figure 4C:
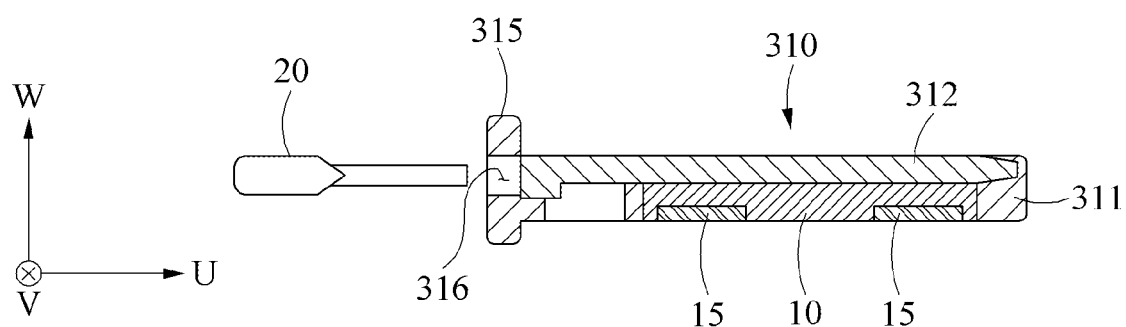
FIG. 4C is a cross-sectional view of an example tray according to various embodiments.

FIG. 4A is a diagram illustrating a top view of the tray 310 according to various embodiments, FIG. 4B is a diagram illustrating a bottom view of the tray 310 according to various embodiments, and FIG. 4C is a cross-sectional view of the tray 310 according to various embodiments.

FIGS. 4A, 4B and 4C illustrate the tray 310 that is an example configuration of the tray device 300 (see FIG. 2B) and an external part 10 that may be accommodated in a seating portion 314 of the tray 310 and a pin 20 that may insert into the pin insertion hole 316 of the tray 310, and FIG. 4C is a cross-sectional view cut along a line A-A' of FIGS. 4A and 4B.

In the following, an example structure of the tray 310 and the tray device 300 is described based on a UVW coordinate system, which represents that a structure and a direction in which the tray device 300 of various example embodiments may apply to the electronic device 201 of FIGS. 2A to 3 may be variously implemented without being limited to a XYZ coordinate direction.

Referring to FIGS. 4A, 4B and 4C, the tray 310 of the tray device 300 according to an example embodiment may include a first body 311, a second body 312, and the tray cover 315.

Figure 6A:
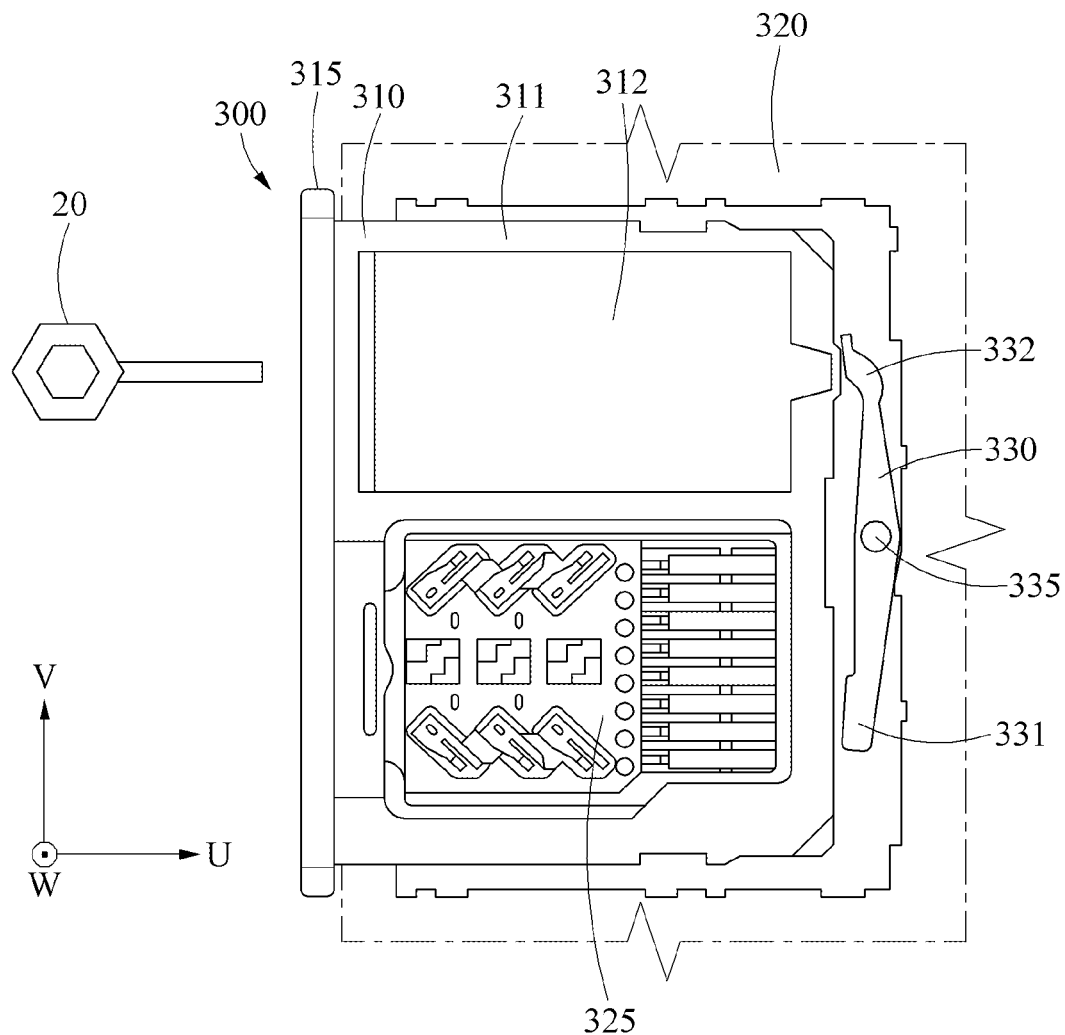
FIG. 6A is a diagram illustrating a top view of an example tray device according to various embodiments.

The tray device 300 of an example embodiment may include the tray 310, the tray socket 320 (see FIG. 6A), and an ejector 330 (see FIG. 6A). The tray 310 of tray device 300 of an example embodiment may accommodate and support the external part 10, the tray socket 320 may be provided in the housing 210 of the electronic device 201, and the ejector 330 may be connected to the tray socket 320 and may press and separate the tray 310 in a separation direction (e.g., −U-axis direction) opposite to the insertion direction (e.g., +U-axis direction). The tray 310 of the tray device 300 of an example embodiment may insert into the tray socket 320 along the insertion direction (e.g., +U-axis direction) and may optionally couple with and separate from the tray socket 320.

The tray device 300 of an example embodiment may provide the external part 10 accommodated in the tray 310 to the tray socket 320, the tray socket 320 may be electrically connected to an internal part of the electronic device 201, and the electronic device 201 may be electrically connected to the external part 10 through the tray device 300.

For example, the tray socket 320 may transmit and obtain an electrical signal through electrical connection to an internal part of the electronic device 201, for example, various parts positioned in the housing 210 of the electronic device 201, such as the processor 120, the memory 130, the input module 150, the communication module 190, and the camera module 180.

The external part 10 detachably provided to the electronic device 201 may be the external part 10 in a card type, such as an external memory card, a subscriber identification module card (SIM card), and a user identity module card (UIM card). The external part 10 of various example embodiments is not limited thereto and may be at least one of an external USB, a communication transceiving module, and an external battery, or may be a component of various types and purposes combinable with and separable from the electronic device 201.

In an example embodiment, the user may separate or couple the external part 10 from or with the electronic device 201 at least once due to various reasons such as replacement of the external part 10, data transfer, and charging. The tray device 300 of various example embodiments may be provided to be exposed in the housing 210 that forms the appearance of the electronic device 201 to easily implement a separation and coupling operation. Without being limited thereto, the tray device 300 may be provided in the cover (not shown) of the housing 210 or a part detachable from the electronic device 201.

In an example embodiment, the tray 310 may include the first body 311 configured to couple with and separate from the tray socket 320 and the second body 312 configured to slidably couple with the first body 311. The first body 311 of various example embodiments may slidably couple with the tray socket 320, and the tray 310 may comprise a double sliding structure in which the first body 311 and the second body 312 are slidable.

The first body 311 of an example embodiment may include the seating portion 314 configured to accommodate and support the external part 10 and may couple with and separate from the tray socket 320. The first body 311 of an example embodiment may include metal, alloy, or plastic, for example, a polycarbonate material, and, without being limited thereto, may include various materials having rigidity. In various example embodiment, the first body 311 may be referred to as a body, a frame, a body portion, or a main body of the tray 310.

The seating portion 314 of an example embodiment may be in a structure of accommodating and supporting the external part 10. When the seating portion 314 couples with the tray 310 and the tray socket 320, a terminal 15 of the external part 10 and a terminal 326 (see FIG. 6C) of the tray socket 320 may be formed at one position of the tray 310 to face each other.

For example, referring to FIG. 4C, the seating portion 314 may support the external part 10 such that the terminal 15 of the external part 10 may be exposed to the outside of the tray 310. The tray 310 of an example embodiment may include at least one seating portion 314 to correspond to types, shapes, or standards of various external parts 10.

The second body 312 of an example embodiment may slidably couple with the first body 311 along the insertion direction (e.g., +U-axis direction) and, when an external force is applied through the pin insertion hole 316, may slidably operate in the insertion direction to press the ejector 330. The second body 312 of an example embodiment may movably couple with one surface of the first body 311 and the second body 312 may interact with the ejector 330 while moving by a pressing structure such as the pin 20.

The second body 312 of an example embodiment may include the same or similar metal, alloy, or patristic material as that of the first body 311, or may include at least a portion of an elastic material having a restoring force. The second body 312 of various example embodiments may be variously implemented without being limited to a formation, a structure, or an operation. Various example embodiments of the second body 312 are further described below with reference to FIG. 7.

In an example embodiment, the seating portion 314 may be formed to pass through a top surface 311a and a bottom surface 311b of the first body 311 and the second body 312 may couple with the top surface 311a of the first body 311 and may at least partially face or contact the seating portion 314. The second body 312 of an example embodiment may be provided to overlap at least a portion of at least one of the seating portions 314 while viewing the top surface 311a of the first body 311.

For example, referring to FIGS. 4A and 4B, the second body 312 may cover the entire one surface of the seating portion 314. The second body 312 of various example embodiments may support the external part 10 by at least partially contacting the external part 10 of the seating portion 314. Alternatively, the second body 312 may slide with being spaced apart from the external part 10 of the seating portion 314.

The tray cover 315 of an example embodiment may be provided on one side of the first body 311, and the tray cover 315 may include the pin insertion hole 316 that communicates in a direction of the second body 312. The tray cover 315 of an example embodiment may comprise a shape corresponding to a coupling structure of the housing 210 and the tray device 300 such that the outer surface of the housing 210 and the tray device 300 may form a smooth appearance when the tray 310 inserts into the tray socket 320.

Figure 5A:
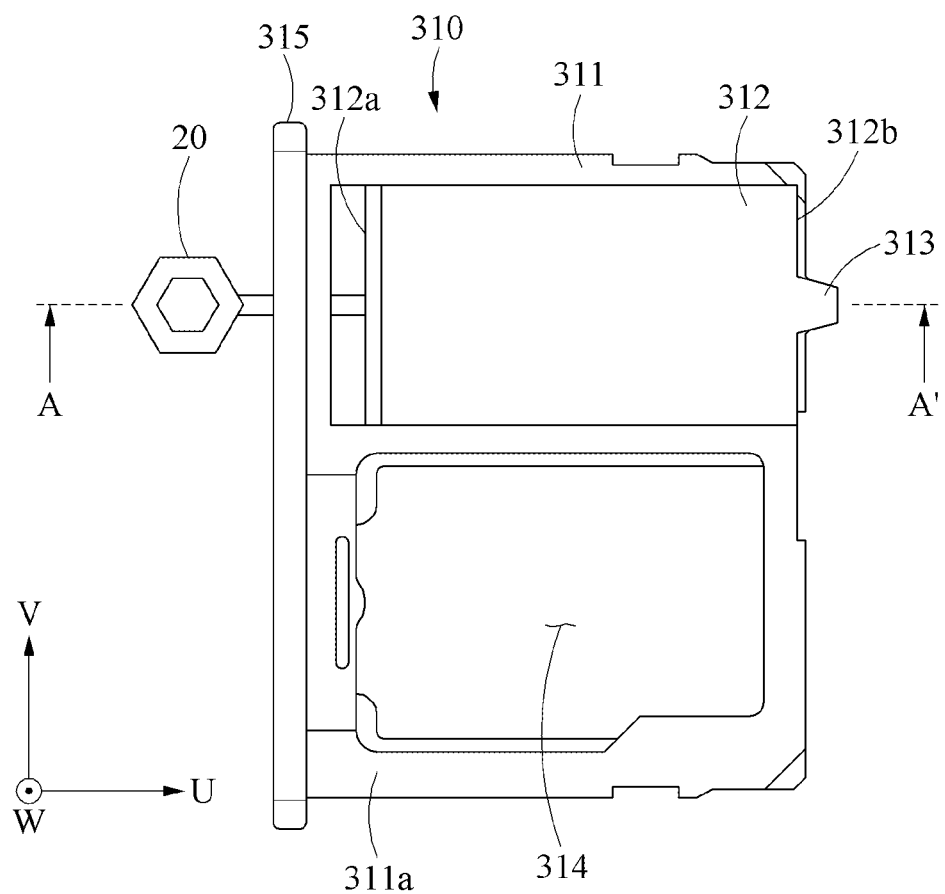
FIG. 5A is a diagram illustrating a top view of an example tray according to various embodiments.
Figure 5B:
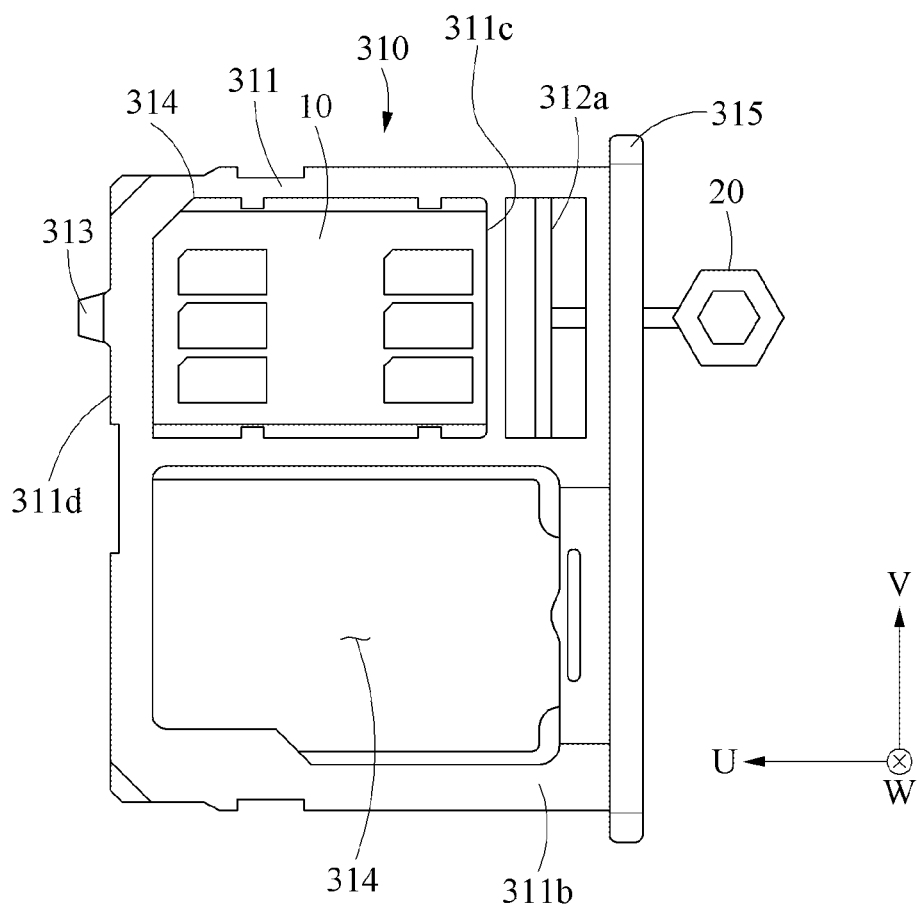
FIG. 5B is a diagram illustrating a bottom view of an example tray according to various embodiments.
Figure 5C:
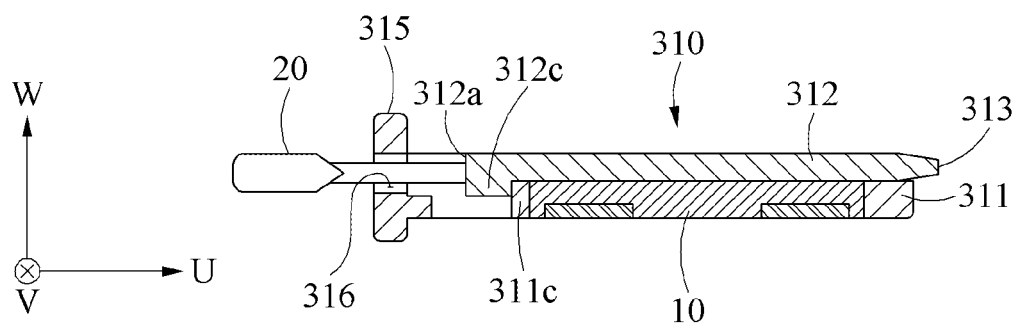
FIG. 5C is a cross-sectional view of an example tray according to various embodiments.

FIG. 5A is a diagram illustrating a top view of the tray 310 according to various embodiments, FIG. 5B is a diagram illustrating a bottom view of the tray 310 according to various embodiments, and FIG. 5C is a cross-sectional view of the tray 310 according to various embodiments.

FIGS. 5A, 5B and 5C illustrate a state in which the pin 20 is inserted into the tray 310 of FIGS. 4A, 4B and 4C, and FIG. 5C is a cross-sectional view cut along a line A-A' of FIGS. 5A and 5B.

The second body 312 of an example embodiment may slidably move through the pin 20 that inserts into the pin insertion hole 316 of the tray cover 315. However, actual implementation is not limited thereto and the tray device 300 of various example embodiments may include a button (not shown) and may move the second body 312 in such a manner that the user or a specific structure presses a button (not shown). Alternatively, a movement of the second body 312 may be automatically controlled by the processor 120 (see FIG. 1) of the electronic device 201.

Hereinafter, an operation of the tray device 300 is described based on an example of a structure in which the pin 20 inserts into the pin insertion hole 316 and moves the second body 312. However, in actual implementation, a shape and a moving structure of the tray device 300 and the second body 312 may be variously implemented within the range that may be apparent to one of ordinary skill in the art based on this disclosure.

The second body 312 of an example embodiment may include a first surface 312a configured to face the pin insertion hole 316 and a second surface 312b configured to face the first surface 312a. A pressing area 313 for pressing the ejector 330 may be formed on the second surface 312b. For example, when the pin 20 inserts into the pin insertion hole 316, the second body 312 may be pressed by the pin 20 and may slide in a preset direction (e.g., +/−U-axis direction) and the pressing area 313 of the second body 312 may press the ejector 330.

When the pressing area 313 of the second body 312 of an example embodiment slides, the pressing area 313 may be in a structure that protrudes outward from one side 311d of the first body 311. The pressing area 313 of an example embodiment may be formed to protrude in an insertion direction (e.g., +U-axis direction) from the second surface 312b, substantially the center of the second surface 312b. Actual implementation is not limited thereto and the pressing area 313 may be implemented in various structures capable of interacting with the ejector 330. A pressing structure of the ejector 330 of an example embodiment is described in greater detail below with reference to FIGS. 6A, 6B and 6C.

The second body 312 of an example embodiment may include a protrusion 312c configured to protrude toward the first body 311, for example, in a direction (e.g., −W-axis direction) of the bottom surface 311b of the first body 311. The first body 311 of an example embodiment may include a stopper 311c in a shape corresponding to a shape of the protrusion 312c of the second body 312 and configured to accommodate the protrusion 312c.

When the second body 312 moves to a specific position by the pin 20, the stopper 311c may be in contact with the protrusion 312c and the stopper 311c may limit the movement range of the second body 312. The protrusion 312c and the stopper 311c of an example embodiment may prevent and/or reduce the second body 312 from moving to more than a preset range by the pin 20 and being separated from the first body 311. Alternatively, the protrusion 312c and the stopper 311c may limit the pressure of the second body 312 that presses the ejector 330 within the preset range.

Figure 6B:
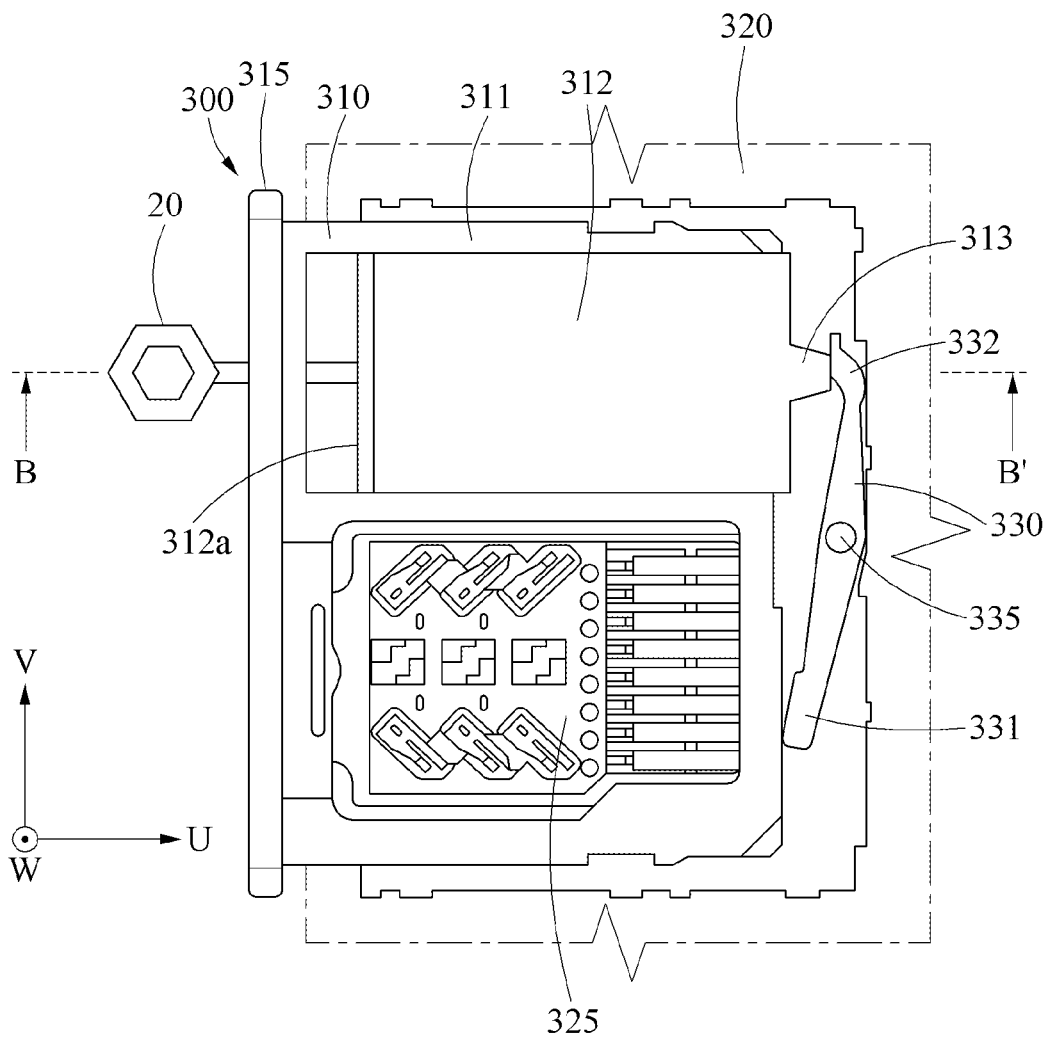
FIG. 6B is a diagram illustrating a top view of a tray device according to various embodiments.
Figure 6C:
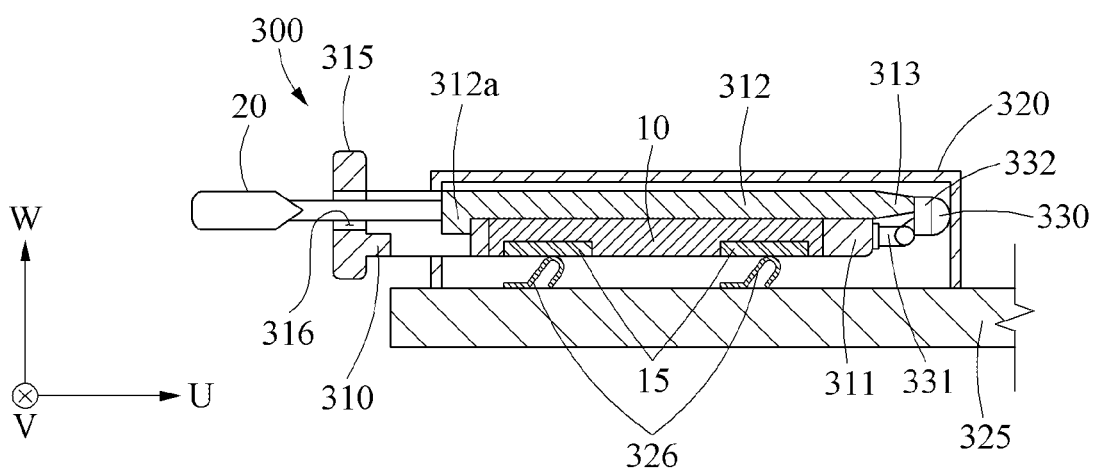
FIG. 6C is a cross-sectional view of an example tray device according to various embodiments.

FIG. 6A is a diagram illustrating a top view of the tray device 300 according to various embodiments, FIG. 6B is a diagram illustrating a top view of the tray device 300 according to various embodiments, and FIG. 6C is a cross-sectional view of the tray device 300 according to various embodiments.

FIGS. 6A, 6B and 6C illustrate the tray 310, the tray socket 320, and the ejector 330 of the tray device 300, FIG. 6A illustrates a state in which the tray 310 couples with the tray socket 320, FIG. 6B illustrates an operation of separating the tray 310 from the tray socket 320, and FIG. 6C is a cross-sectional view cut along a line B-B' of FIG. 6B.

Referring to FIGS. 6A, 6B and 6C, a process in which the second body 312 of the tray socket 320 of an example embodiment slides to press the ejector 330 and to separate the first body 311 from the tray socket 320 may be verified.

The tray socket 320 of an example embodiment may include at least one recognizer 325 provided at a position at which the recognizer 325 faces the seating portion 314 of the first body 311. The recognizer 325 may include the external part 10, for example, the terminal 326 corresponding to an external memory card, a SIM card, or a UIM card, configured to be accommodated in the seating portion 314. The recognizer 325 may be electrically connected to an internal part provided in the housing 210 of the electronic device 201, such as a processor (e.g., the processor 120 of FIG. 1), a memory (e.g., the memory 130 of FIG. 1), or a PCB (e.g., the PCB 251, 252 of FIG. 3).

The ejector 330 of an example embodiment may include a rotating shaft 335 and may include a first end 331 and a second end 332 configured to be rotatable based on the rotating shaft 335 and to extend based on the rotating shaft 335.

The first end 331 of an example embodiment may extend in a direction in which the ejector 330 rotates and interferes with the first body 311, and the second end 332 may extend in a direction in which the ejector 330 rotates and interferes with the second body 312.

The first end 331 and the second end 332 of an example embodiment may be formed to correspond to an arrangement structure of the first body 311 and the second body 312, and the first end 331 and the second end 332 may be formed as a single body. Although not illustrated, the first end 331 and the second end 332 may be supported by an elastic structure (not shown) such as a spring and a rubber.

Referring to FIGS. 6B and 6C, the tray device 300 of an example embodiment may slide in such a manner that, when the pin 20 inserts into the pin insertion hole 316, the pin 20 presses the first surface 312a of the second body 312 and the pressing area 313 formed on the second surface 312b may press the second end 332 of the ejector 330.

For example, when the second body 312 slides and presses the second end 332, the ejector 330 may rotate based on the rotating shaft 335 and the first end 331 of the ejector 330 may also rotate and press the first body 311 to push and separate the tray 310 from the tray socket 320.

The ejector 330 of an example embodiment may rotate based on the rotating shaft 335 while the second end 332 is being pressed. In the ejector 330 of various example embodiments, when the first end 331 extends in a direction opposite to that of the second end 332 from the rotating shaft 335, the first end 331 may press and push the first body 311 in a direction opposite to that of the pressure applied to the second end 332. As a result, the tray 310 may be separated from the tray socket 320.

The tray device 300 of various example embodiments may include the second body 312 configured to slidably couple with the first body 311 of the tray 310, and the second body 312 may optionally press the ejector 330 and may separate the tray 310 from the tray socket 320. The tray device 300 of an example embodiment or the electronic device 201 including the tray device 300 may press the ejector 330 and may easily separate the tray 310 without including a separate additional component that is formed adjacent to the tray 310 to press the ejector 330.

The tray device 300 of an example embodiment may improve space efficiency by minimizing and/or reducing a space for providing a detachable structure of the tray 310 through the first body 311 and the second body 312. For example, the length (d) occupied through coupling of the tray device 300 of FIG. 2B and the length (d) of a long axis may be minimized and/or reduced.

By securing the space efficiency and by providing an additional PCB (e.g., the PCB 251, 252 of FIG. 3) in the secured space in designing the arrangement structure of the tray device 300 in the electronic device 201, it is possible to contribute to slimness and lightness of the electronic device 201. Further, by improving an external design of a product, it is possible to assist in forming various appearances of the electronic device 201.

The second body 312 of various example embodiments may be coupled with and formed on one surface of the first body 311 and may be in a planar structure in which the second body 312 faces the external part 10 or in a pillar structure of minimizing and/or reducing a cross-sectional area. Hereinafter, various structures of the first body 311 and the second body 312 of the tray 310 are described with reference to the accompanying drawings.

Figure 7:
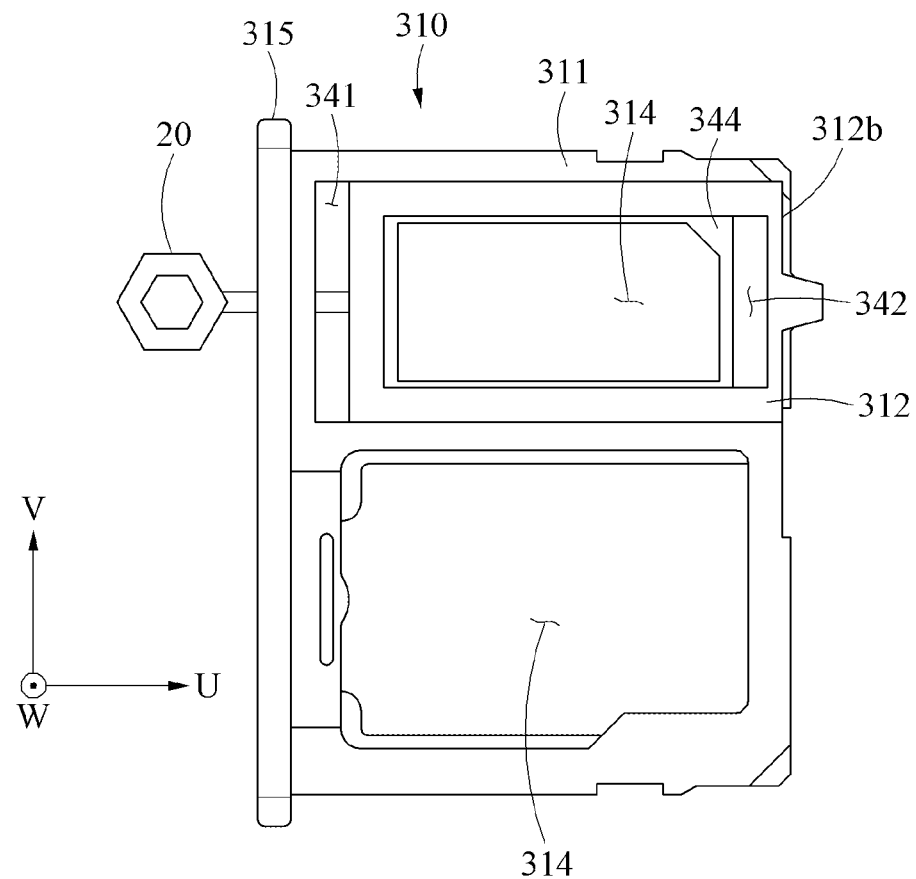
FIG. 7 is a diagram illustrating a top view of an example tray according to various embodiments.

FIG. 7 is a diagram illustrating a top view of the tray device 300 according to various embodiments.

Referring to FIG. 7, the tray device 300 according to an example embodiment may include a first open area 341 and a second open area 342.

The first open area 341 of an example embodiment may be formed on the first body 311 and may be in a structure that surrounds at least a portion of an area adjacent to the seating portion 314. The second body 312 of an example embodiment may couple with the first body 311 in contact with at least a portion of the first open area 341. The second body 312 of an example embodiment may slide within the first open area 341.

The second open area 342 of an example embodiment may be formed on the second body 312, the second open area 342 may be formed in an area in which the second body 312 faces the seating portion 314, and the second open area 342 may accommodate the seating portion 314. The first body 311 of an example embodiment may include a support frame 344 configured to surround the seating portion 314 and the support frame 344 may be provided in the second open area 342.

The second open area 342 of an example embodiment may have a width (e.g., a length in V-axis direction) and a length (e.g., a length in U-axis direction) corresponding to an area of the seating portion 314 and the support frame 344 may have an extended length for the second body 312 to correspond to a sliding range. The second body 312 of an example embodiment may be in a structure that surrounds the seating portion 314 and the support frame 344, and the second body 312 may comprise a single layer structure and a single story structure with the first body 311, which may minimize/reduce a thickness occupied by the first body 311 and the second body 312.

Although not illustrated, a structure in which the first body 311 supports the support frame 344 may be provided on the rear surface of the tray 310 illustrated in FIG. 7. For example, a bridge (not shown) connected from the first body 311 to the support frame 344 may be provided. In this case, the second body 312 may comprise a groove structure (not shown) within a movable range contactable with the bridge.

Figure 8:
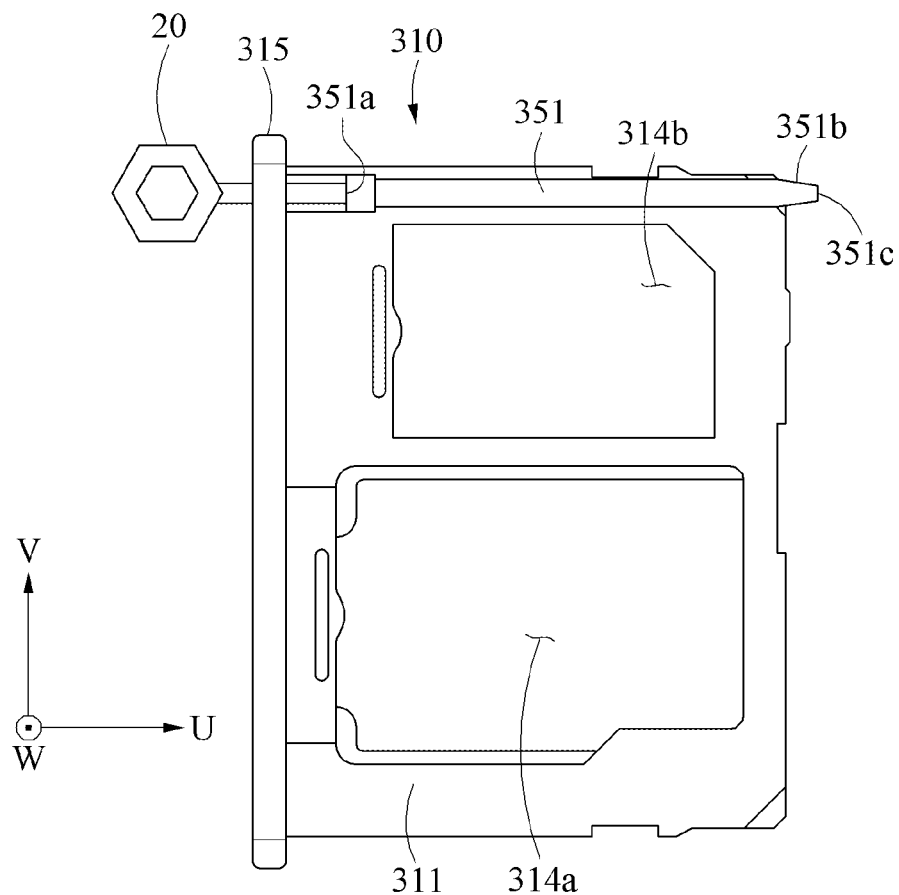
FIG. 8 is a diagram illustrating a top view of an example tray according to various embodiments.
Figure 9:
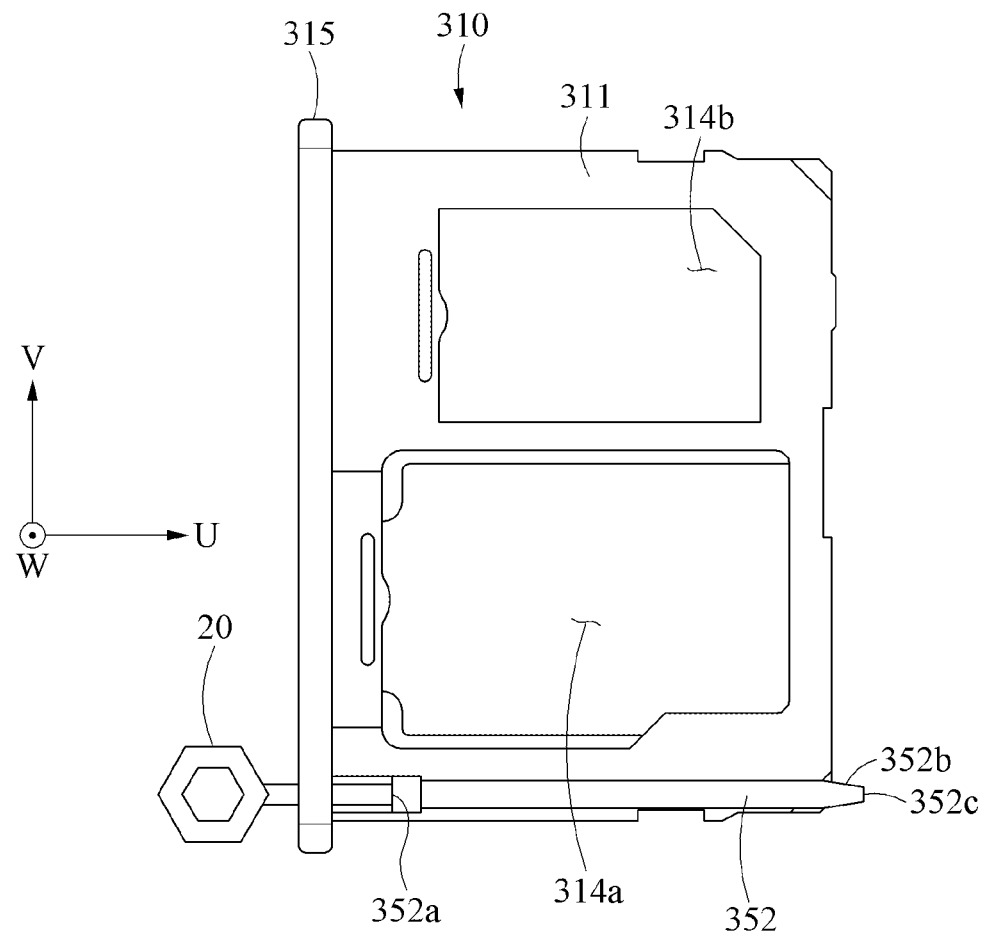
FIG. 9 is a diagram illustrating a top view of an example tray according to various embodiments.

FIG. 8 is a diagram illustrating a top view of the tray 310 according to various embodiments, and FIG. 9 is a diagram illustrating a top view of the tray 310 according to various embodiments.

Referring to FIGS. 8 and 9, second bodies 351 and 352 of an example embodiment may couple with the first body 311 to be spaced apart from the seating portion 314 of the tray 310.

The first body 311 of an example embodiment may include a plurality of seating portions 314. For example, a plurality of seating portions 314a and 314b may include a first seating portion 314a configured to accommodate and support an external memory card and a second seating portion 314b configured to accommodate and support a SIM card or a UIM card. Without being limited thereto, at least three seating portions 314 may be provided and may be designed in various structures and thereby provided to the first body 311. Such an arrangement is described in greater detail below with reference to FIG. 13A.

Referring to FIG. 8, the second body 351 of an example embodiment may be provided to be spaced apart from one side of the second seating portion 314b, and the first seating portion 314a may be provided on one side different from one side on which the second body 351 of the second seating portion 314b is provided. When the pin 20 inserts into the tray 310, the second body 351 of an example embodiment may slide in such a manner that the first surface 351a is pressed by the pin 20 and a pressing area 351c formed on a second surface 351b may move to press the ejector 330 (see FIG. 6A).

Referring to FIG. 9, the second body 352 of an example embodiment may be provided to be spaced apart from one side of the first seating portion 314a, and the second seating portion 314b may be provided on one side different from one side on which the second body 352 of the first seating portion 314a is provided. When the pin 20 inserts into the tray 310, the second body 352 of an example embodiment may slide in such a manner that the first surface 352a is pressed by the pin 20 and a pressing area 352c formed on a second surface 352b may move to press the ejector 330.

The second bodies 351 and 352 of various example embodiments may slidably couple with a partial area of the first body 311 according to various factors, such as a type of the external part 10 accommodated in the plurality of seating portions 314a and 314b or an internal party of the electronic device 201 connected to the plurality of recognizers 325 (see FIG. 6A), a circuit or wire structure of the electronic device 201, or an internal design of the electronic device 201, and may improve space utilization of the tray device 300 and the electronic device 201 including the tray device 300.

Figure 10A:
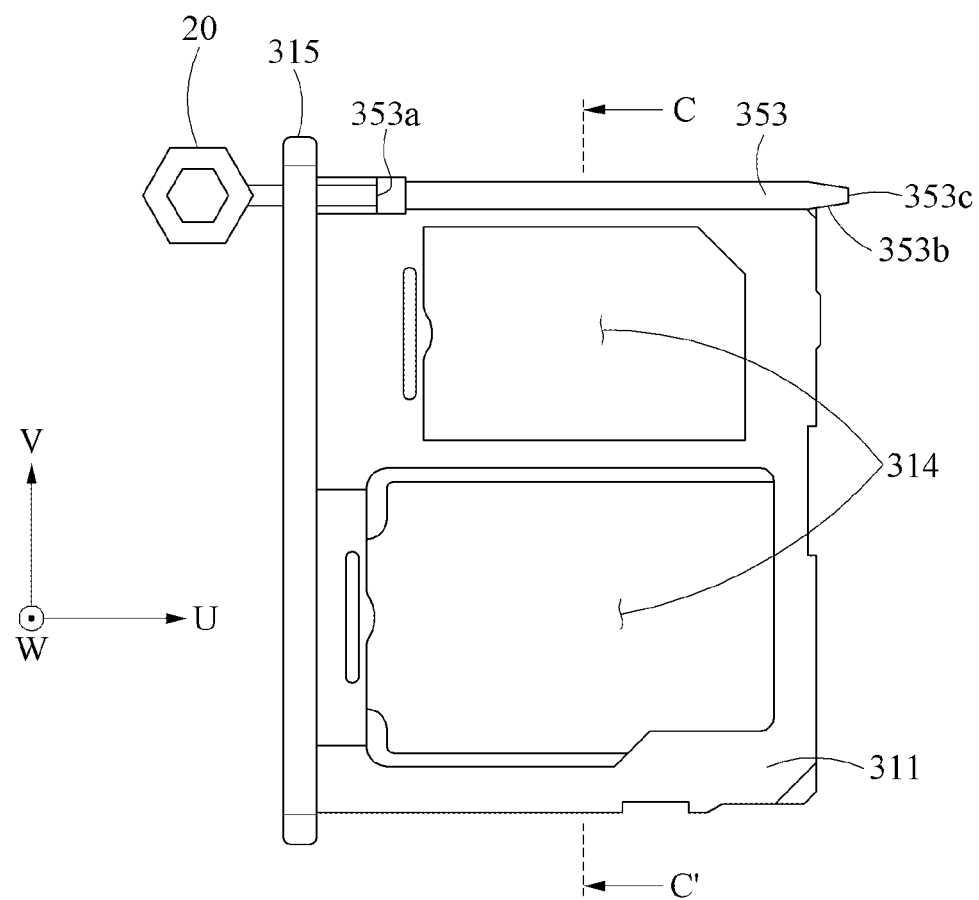
FIG. 10A is a diagram illustrating a top view of an example tray according to various embodiments.
Figure 10B:
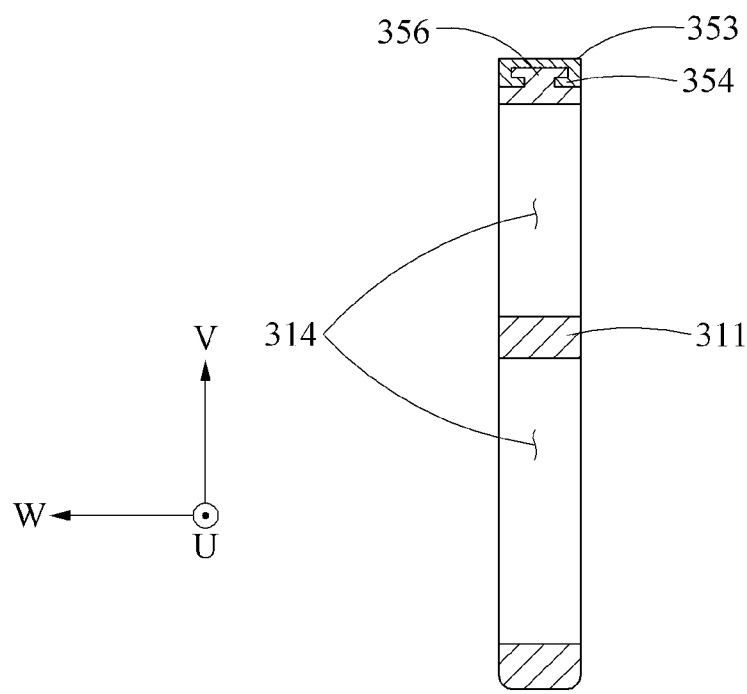
FIG. 10B is a cross-sectional view of an example tray according to various embodiments.

FIG. 10A is a diagram illustrating a top view of the tray 310 according to various embodiments, and FIG. 10B is a cross-sectional view of the tray 310 according to various embodiments. FIG. 10B is a cross-sectional view cut along a line C-C' of FIG. 10A.

Referring to FIGS. 10A and 10B, the second body 312 of the tray device 300 of an example embodiment may couple with one side surface of the first body 311.

The second body 353 of an example embodiment may couple with another side surface adjacent to one side surface of the first body 311 on which the tray cover 315 is provided and may slide.

For example, the second body 353 may be provided at one of both side ends of the first body 311 parallel to the insertion direction (e.g., +U-axis direction). A first surface 353a may be pressed in a direction (e.g., +U-axis direction) in which the pin 20 inserts into the tray cover 315 and a pressing area 353c of a second surface 353b may slide toward the ejector 330 (see FIG. 6A).

Referring to FIG. 10B, the first body 311 of an example embodiment may include a rail head 356 formed on one side surface and the second body 312 may include an uneven portion 354 configured to surround the rail head 356, and the second body 353 may be supported to not be separated from the first body 311 and may slidably move on one side surface of the first body 311.

A coupling structure of the first body 311 and the second body 353 of FIG. 10B may be one of various example embodiments. Actual implementation is not limited thereto and a sliding structure of the second body 353 may be implemented in various structures.

For example, the second body 353 of an example embodiment may couple with a groove (not shown) that accommodates the second body 353 in a first structure and thereby move, or the second body 353 may include a wheel structure (not shown).

The first body 311 and the second body 353 of an example embodiment may include a coupling structure (not shown) with mutual magnetism and thereby implement a structure in which the second body 353 slides through coupling with one surface of the first body 311. In addition, a sliding structure may be implemented such that the second body 353 and the first body 311 may be variously modified within the range easily derivable by one of ordinary skill in the art.

Figure 11A:
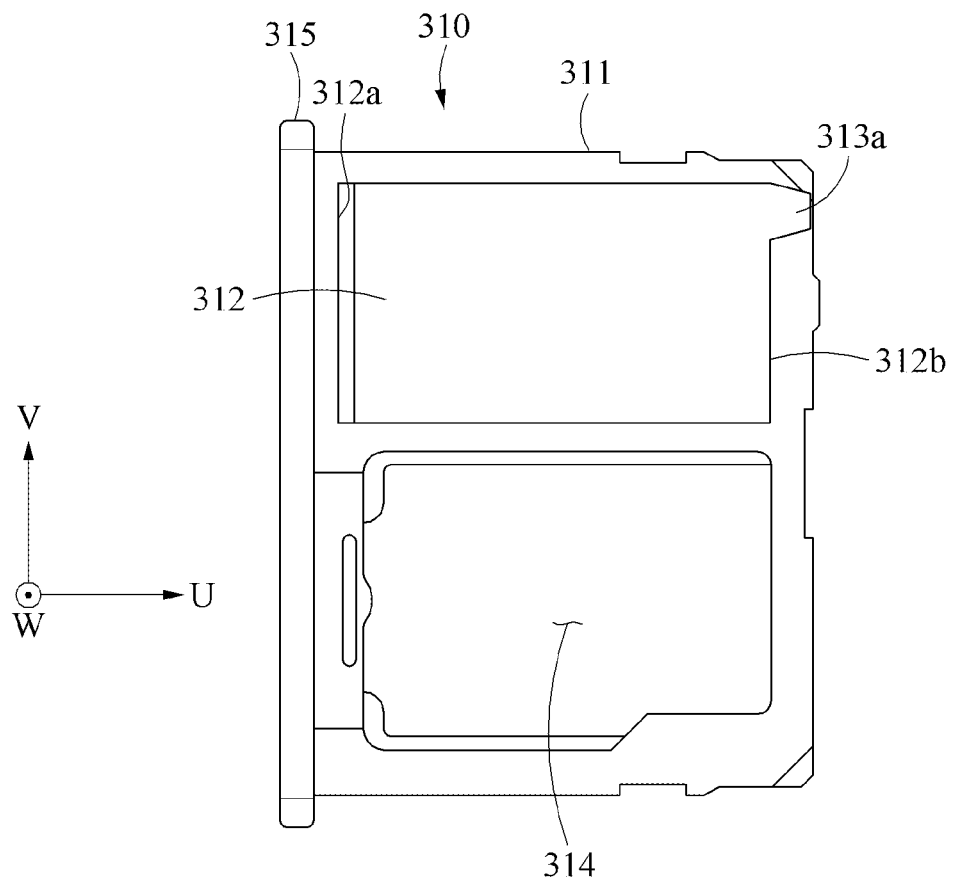
FIG. 11A is a diagram illustrating a top view of an example tray according to various embodiments.
Figure 11B:
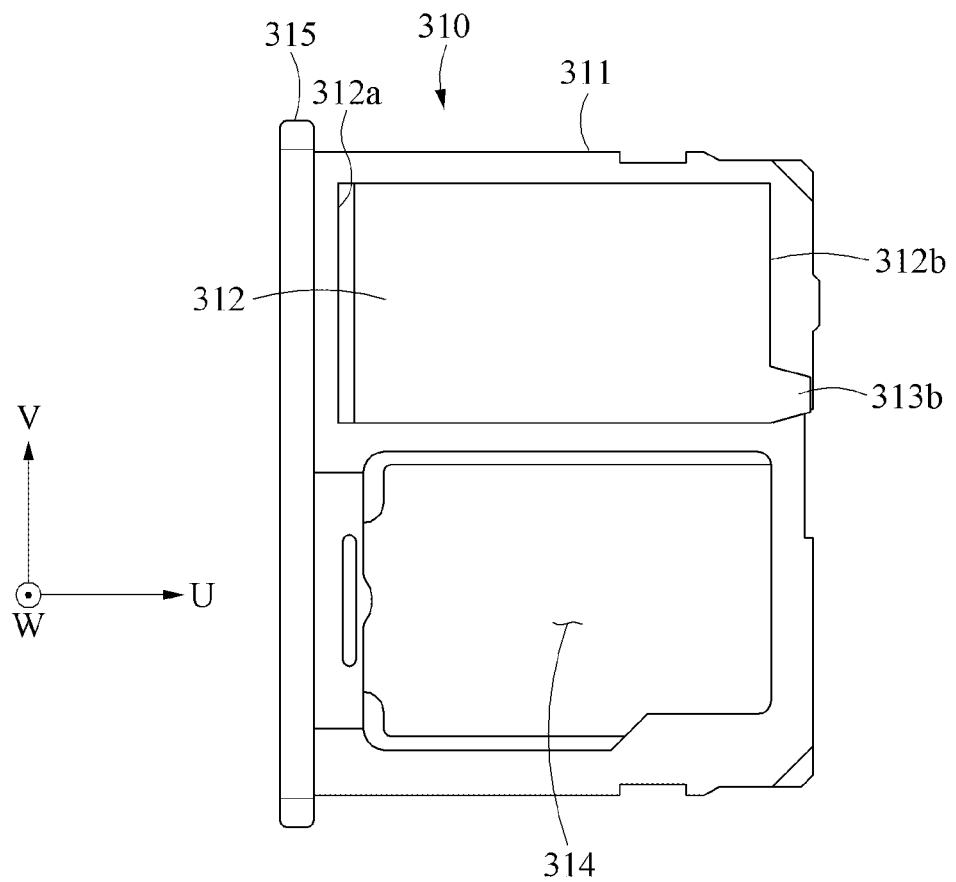
FIG. 11B is a diagram illustrating a top view of an example tray according to various embodiments.
Figure 11C:
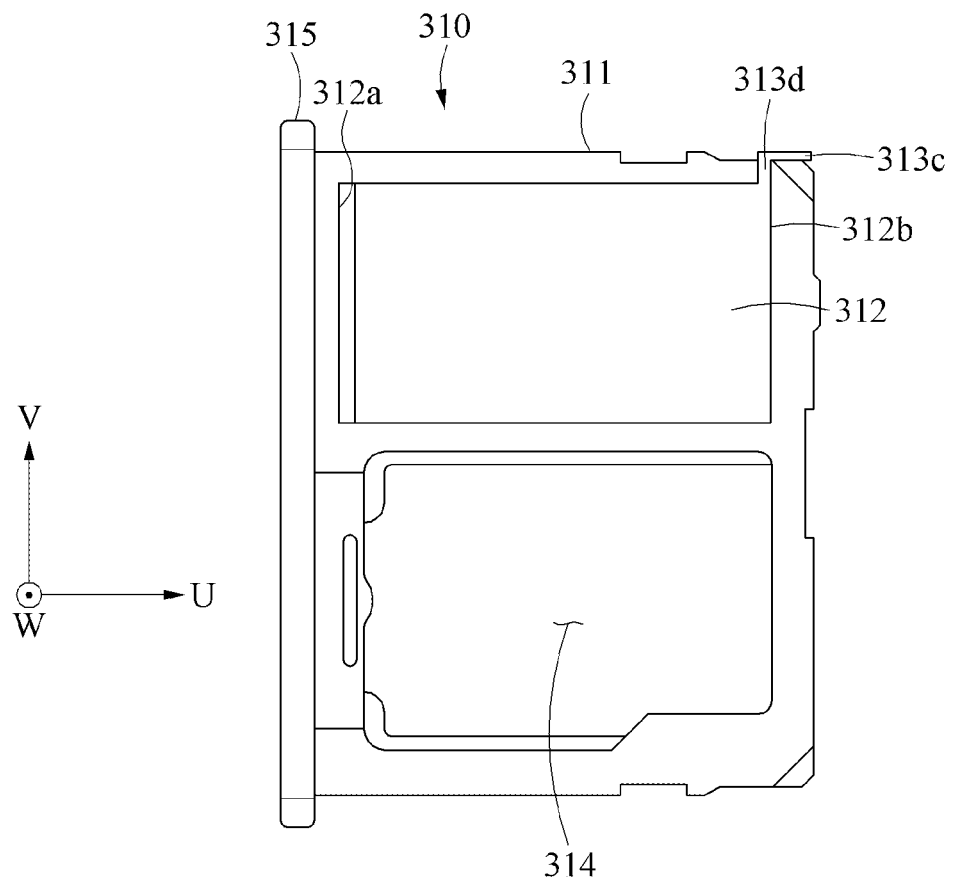
FIG. 11C is a diagram illustrating a top view of an example tray according to various embodiments.

FIGS. 11A, 11B and 11C are diagrams illustrating top views of the tray 310 according to various embodiments.

Referring to FIGS. 11A, 11B and 11C, the second body 312 of an example embodiment may include a pressing area 313a, 313b, 313c in various shapes.

The pressing area 313a, 313b, 313c of an example embodiment may be formed on the second surface 312b that faces the first surface 312a pressed by the pin 20 of the second body 312. When the pin 20 inserts into the tray cover 315, the second body 312 may slide and the pressing area 313a, 313b, 313c may press the ejector 330.

The pressing area 313a, 313b, 313c of an example embodiment may be implemented in various structures in consideration of a structure design of the tray device 300 that includes the ejector 330 and the tray socket 320 and the electronic device 201. For example, the pressing area 313a, 313b, 313c of an example embodiment may be formed on a portion separate from the center of the second surface 312b and adjacent to an edge of the second surface 312b rather than the center of the second surface 312b, and may be formed adjacent to one end of the second surface 312b.

Referring to FIG. 11A, the pressing area 313a of the second body 312 of an example embodiment may be formed adjacent to one outer side surface of the first body 311, the second end 332 (see FIG. 6A) of the ejector 330 (see FIG. 6A) may be formed adjacent to an end of the tray 310, and the ejector 330 may secure a distance from the second end 332 to the rotating shaft 335 or the first end 331 (see FIG. 6A).

For example, the ejector 330 of an example embodiment may comprise an increased distance from the second end 332 to the rotating shaft 335, a rotational moment value obtained by the ejector 330 based on the rotating shaft 335 may increase, and a minimum pressure to be applied by the pin 20 to separate the tray 310 from the tray socket 320 may decrease accordingly.

Referring to FIG. 11B, the pressing area 313b of the second body 312 may be formed adjacent to the center of the first body 311, the second end 332 of the ejector 330 of an example embodiment may be formed adjacent to the center of the first body 311, and the ejector 330 may reduce a distance from the second end 332 to the rotating shaft 335 or the first end 331. In this manner, an area occupied by the ejector 330 may be minimized/reduced.

For example, the ejector 330 of an example embodiment may reduce a distance from the second end 332 to the rotating shaft 335, the area occupied by the ejector 330 in the tray device 300 may be minimized/reduced, and the entire area of the tray device 300 may be reduced. The electronic device 201 of an example embodiment may contribute to slimness and lightness of the electronic device 201 by providing an additional PCB or internal part to a space secured by reducing the space of the ejector 330.

Referring to FIG. 11C, the pressing area 313c of the second body 312 of an example embodiment may include at least one bent area 313d, and the pressing area 313c may be bent at least once toward the ejector 330 through the bent area 313d.

Referring to FIG. 11C, the bent area 313d of an example embodiment may be formed based on a structure (e.g., see FIG. 6A) in which the ejector 330 is provided on one surface that faces the tray cover 315.

The second body 312 of an example embodiment may be designed to comprise at least one bent area 313d. For example, the second body 312 may include at least one bent area 313d to set a pressing direction of the pressing area 313c in consideration of an arrangement of the ejector 330, a structure of the ejector 330, or a structure of the tray device 300. The second body 312 of an example embodiment may secure flexibility in terms of a shape and arrangement of the ejector 330 and the tray 310 through the bent area 313d, and may reduce an area occupied by the tray device 300 in the electronic device 201.

Hereinafter, various example embodiments related to an arrangement of the seating portion 314 of the first body 311 and the second body 312 are described below with reference to FIGS. 12A, 12B, 13A, 13B, 14A and 14B.

Figure 12A:
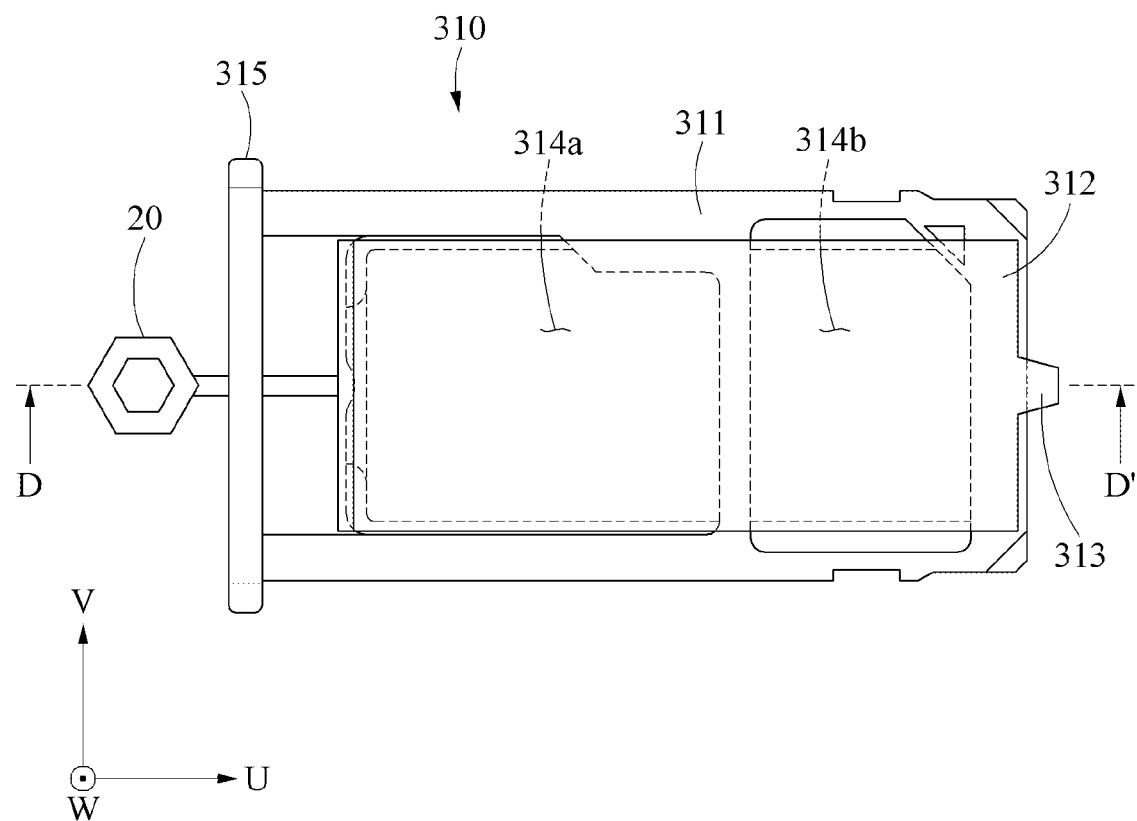
FIG. 12A is a diagram illustrating a top view of an example tray according to various embodiments.
Figure 12B:
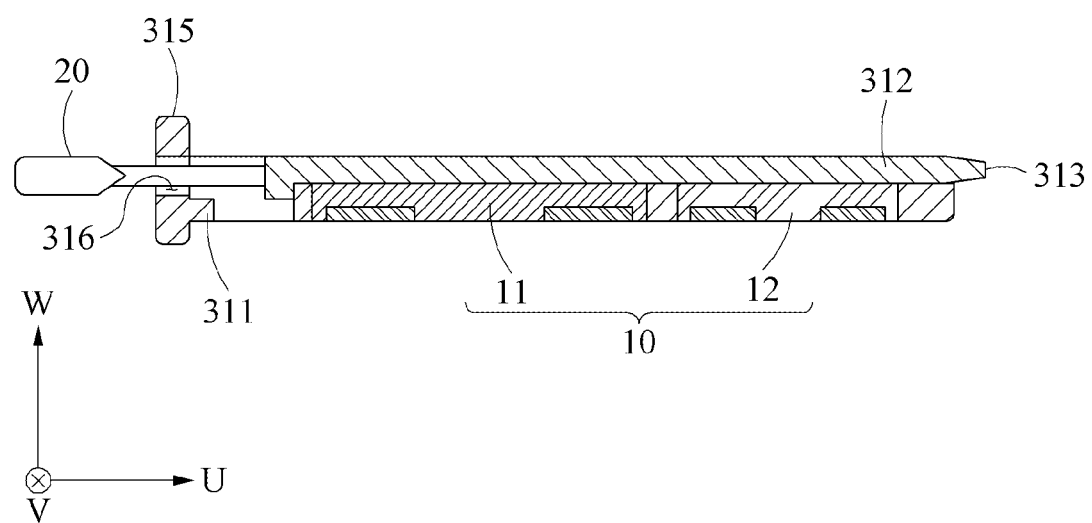
FIG. 12B is a cross-sectional view of an example tray according to various embodiments.

FIG. 12A is a diagram illustrating a top view of the tray 310 according to various embodiments, and FIG. 12B is a cross-sectional view of the tray 310 according to various embodiments. FIG. 12B is a cross-sectional view cut along a line D-D' of FIG. 12A.

Referring to FIGS. 12A and 12B, the first body 311 may include the plurality of seating portions 314a and 314b, and the plurality of seating portions 314a and 314b may be provided in a pressing direction (e.g., +/−U-axis direction) of the pin 20.

The plurality of seating portions 314a and 314b of an example embodiment may include the first seating portion 314a and the second seating portion 314b, and each may support a different type of external part 10. For example, the plurality of seating portions 314a and 314b may include the first seating portion 314a configured to accommodate and support an external memory card 11 and the second seating portion 314b configured to accommodate and support a SIM card or a UIM card 12.

The first seating portion 314a and the second seating portion 314b of an example embodiment may be arranged in a line in the pressing direction (e.g., +/−U-axis direction) of the pin 20, and the second body 312 may couple with the first body 311 and slide in contact with upper and lower directions (e.g., +/−W-axis direction) of the first seating portion 314a and the second seating portion 314b and the pressing area 313 may press the ejector 330.

The tray 310 of an example embodiment may minimize/reduce an area occupied by the plurality of seating portions 314 in a direction (e.g., +/−V-axis direction) parallel to the tray cover 315 in such a manner that the plurality of seating portions 314a and 314b is arranged in a line and an area. For example, the tray device 300 may minimize/reduce the length (d) occupied by the tray device 300 of FIG. 2B through coupling with the housing 210 of the electronic device 201 and the length (d) of the long axis.

Figure 13A:
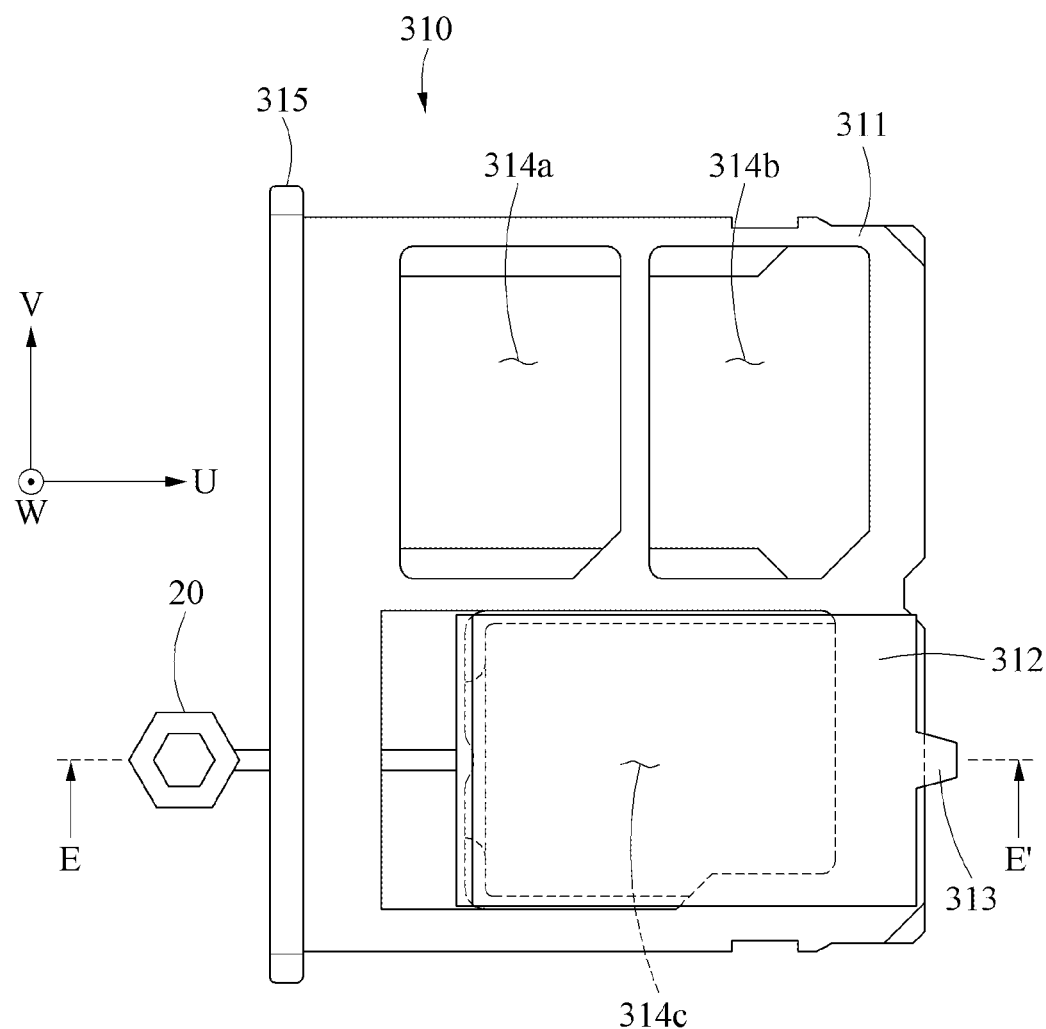
FIG. 13A is a diagram illustrating a top view of an example tray according to various embodiments.
Figure 13B:
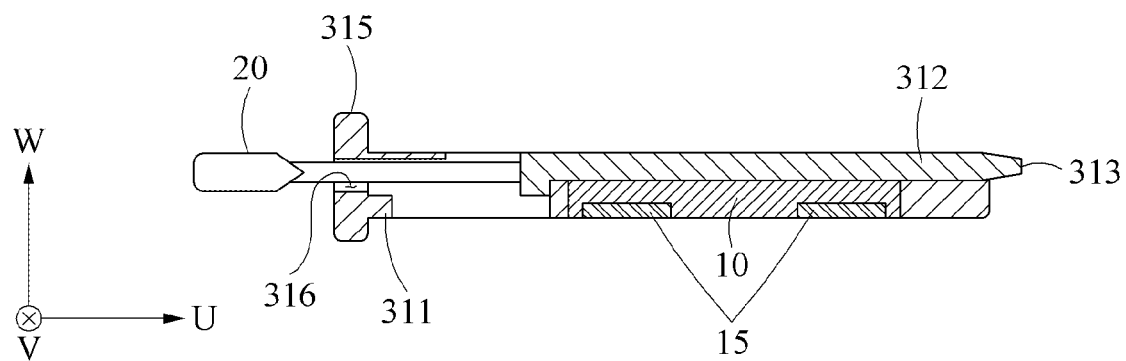
FIG. 13B is a cross-sectional view of an example tray according to various embodiments.

FIG. 13A is a diagram illustrating a top view of the tray 310 according to various embodiments, and FIG. 13B is a cross-sectional view of the tray 310 according to various embodiments. FIG. 13B is a cross-sectional view cut along a line E-E' of FIG. 13A.

Referring to FIGS. 13A and 13B, the first body 311 may include a plurality of seating portions 314a, 314b, and 314c.

The plurality of seating portions 314a, 314b, and 314c of an example embodiment may include the first seating portion 314a, the second seating portion 314b, and a third seating portion 314c, and at least a portion thereof may support different types of external parts 10. For example, the plurality of seating portions 314a, 314b, and 314c may include the first seating portion 314a configured to accommodate and support an external memory card and the second seating portion 314b and the third seating portion 314c each configured to accommodate and support a SIM card (or a UIM card).

The second seating portion 314b and the third seating portion 314c of an example embodiment may be in the same or similar shape and may accommodate the same or similar type of external parts 10. Alternatively, each of the second seating portion 314b and the third seating portion 314c may accommodate a SIM card with a different communication frequency or reception range. The second seating portion 314b and the third seating portion 314c of an example embodiment may be in different shapes to accommodate a micro SIM card and a nano SIM card according to a country-specific regulation, respectively.

The plurality of seating portions 314a, 314b, and 314c of an example embodiment may be arranged in various structures in the first body 311. For example, one (e.g., the first seating portion 314a) comprising a relatively large area among the plurality of seating portions 314 may be provided as illustrated in FIG. 13A to face at least one surface of each of remaining(e.g., the second seating portion 314b and the third seating portion 314c). Without being limited thereto, the plurality of seating portions 314a, 314b, and 314c may be arranged in a line in a direction parallel (e.g., +/−U-axis direction) or a direction perpendicular (e.g., +/−V-axis direction) to the pressing direction (e.g., +/−U-axis direction) of the pin 20.

The second body 312 of an example embodiment may couple with the first body 311 and slide in contact with at least a portion of at least one of the plurality of seating portions 314a, 314b, and 314c, and the pressing area 313 may press the ejector 330.

Figure 14A:
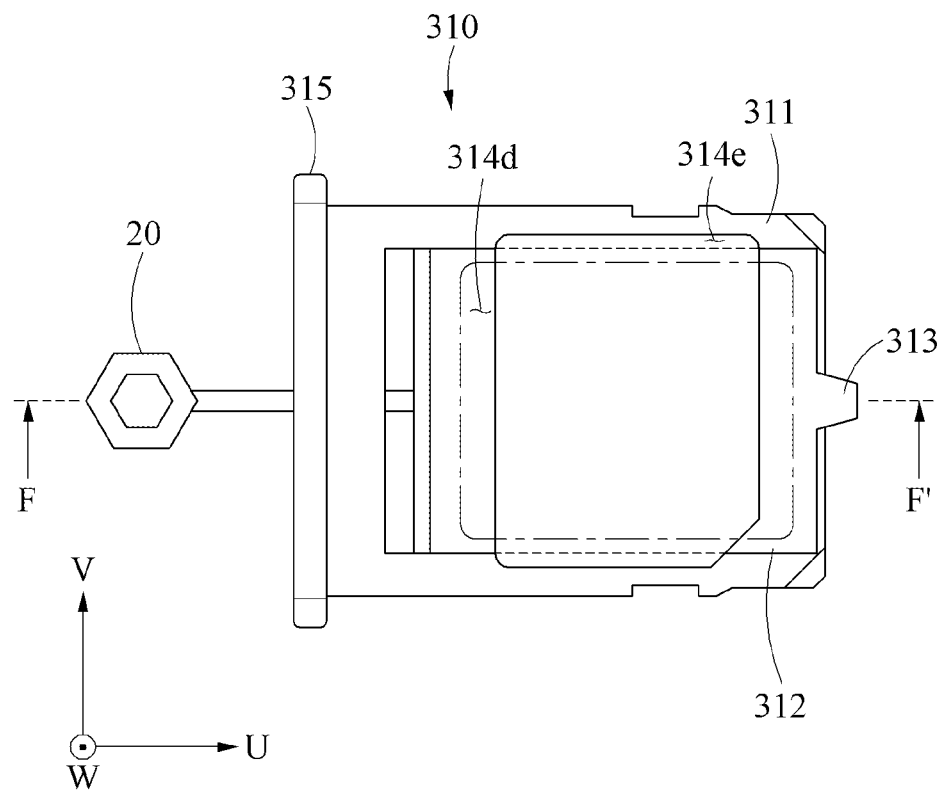
FIG. 14A is a diagram illustrating a top view of an example tray according to various embodiments.
Figure 14B:
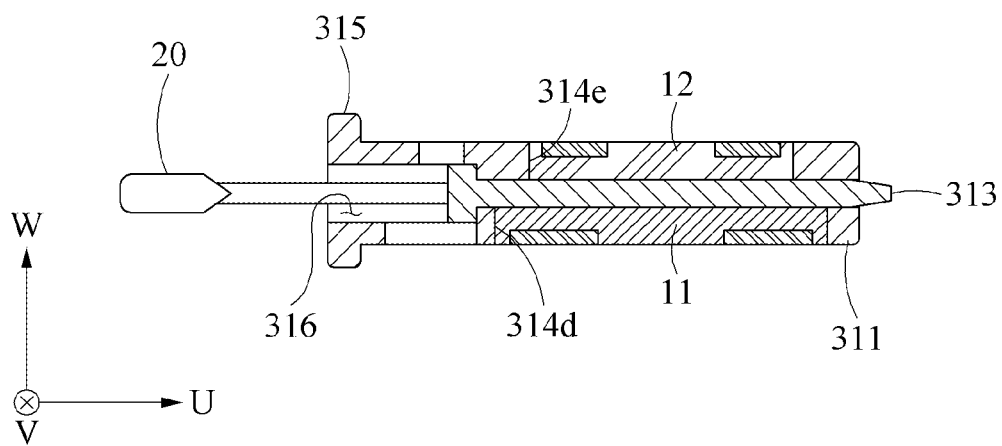
FIG. 14B is a cross-sectional view of an example tray according to various embodiments.

FIG. 14A is a diagram illustrating a top view of the tray 310 according to various embodiments, and FIG. 14B is a cross-sectional view of the tray 310 according to various embodiments. FIG. 14B is a cross-sectional view cut along a line E-E' of FIG. 14A.

Referring to FIGS. 14A and 14B, the first body 311 may include a plurality of seating portions 314d and 314e. The plurality of seating portions 314d and 314e may be formed in an upper direction (e.g., +W direction) and a lower direction (e.g., −W direction) of the first body 311, respectively.

The plurality of seating portions 314d and 314e of an example embodiment may be in a structure in which the first seating portion 314d and the second seating portion 314e are stacked, and may be in a multi-layer structure in which the second body 312 is provided to slide between the first seating portion 314d and the second seating portion 314e.

For example, the first seating portion 314d may be formed in the lower direction of the first body 311 to accommodate and support the external memory card 11, the second seating portion 314e may be formed in the upper direction of the first body 311 to accommodate and support the SIM card or the UIM card 12, and the second body 312 may be slidably provided between the first seating portion 314d and the second seating portion 314e.

The pin insertion hole 316 of an example embodiment may be formed adjacent to the center of the first seating portion 314d and second seating portion 314e to accommodate the pin 20, the pin 20 may press the second body 312 between the first seating portion 314d and the second seating portion 314e, and the pressing area 313 may protrude outward from the first body 311 to press the ejector 330.

The tray 310 of an example embodiment may minimize/reduce a cross-sectional area occupied by the plurality of seating portions 314 since the plurality of seating portions 314 and the second body 312 are stacked. For example, the tray device 300 may minimize/reduce the length (d) occupied by the tray device 300 of FIG. 2B by coupling with the housing 210 of the electronic device 201 and the length (d) of the long axis. Further, it is possible to contribute to slimness of the tray device 300 and the electronic device 201 by minimizing/reducing an area of the tray 310 occupied in the pressing direction (e.g., +/−U-axis direction) of the pin 20.

The electronic device according to various example embodiments may include the housing, a tray socket provided in the housing, a tray configured to be inserted into the tray socket along an insertion direction, and an ejector configured to connect to the tray socket and to press and separate the tray in a separation direction opposite to the insertion direction. The tray may include: a first body in which a seating portion configured to accommodate and support an external part is provided and configured to detachably couple with the tray socket, a second body configured to slidably couple with the first body along the insertion direction, and a tray cover configured to connect to the first body and to be exposed to the outside based on a state in which the tray is inserted into the tray socket and in which a pin insertion hole enabling communication between the second body and the outside is formed. The second body may slidably operate in the insertion direction to press the ejector based on an external force being applied through the pin insertion hole.

In various example embodiments, the seating portion may pass through the top surface and the bottom surface of the first body, and the second body may couple with the first body in contact with at least a portion of the seating portion when viewed from a the top surface of the first body.

In various example embodiments, the first body may include the first open area surrounding at least a portion of an area adjacent to the seating portion, and the second body may be configured to couple with the first body in contact with at least a portion of the first open area.

In various example embodiments, the second body may include a second open area formed in an area facing the seating portion to accommodate the seating portion.

In various example embodiments, the second body may include a protrusion configured to protrude toward the first body, and the first body may include a stopper configured to accommodate the protrusion and to limit a movement range of the second body.

In various example embodiments, the second body may couple with the first body to be spaced apart from the seating portion.

In various example embodiments, the second 312 may be provided at one of both ends of the first body parallel to the insertion direction.

In various example embodiments, the plurality of seating portions may be formed in the first body, and the second body may overlap at least a portion of at least one of the plurality of seating portions when viewed from the top surface of the first body.

In various example embodiments, the plurality of seating portions may include a first seating portion formed on the top surface of the first body and a second seating portion formed on the bottom surface of the first body. The second body may be provided to slide between the first seating portion and the second seating portion.

In various example embodiments, the second body may include the a surface configured to face the pin insertion hole and a second surface configured to face the first surface and including a pressing area configured to press the ejector.

In various example embodiments, the pressing area may be formed to substantially protrude in the insertion direction from the center of the second surface.

In various example embodiments, the pressing area may be provided in a portion adjacent to an edge of the second surface.

In various example embodiments, the pressing area may be bent at least once toward the ejector.

In various example embodiments, the ejector may include a rotating shaft configured to couple with the tray socket such that the ejector is rotatable, a first end extending in a direction in which contact the first body while the ejector rotates, and a second end extending in a direction in which contact the second body while the ejector rotates.

In various example embodiments, when the second body is configured to slide and press the second end, the ejector may be configured to rotate such that the first end may press the first body and push the tray from the tray socket.

Although example embodiments are illustrated and described, the disclosure is not limited to the specific example embodiment and it will be apparent that various modifications may be made by one of ordinary skill in the art to which the disclosure pertains without departing from the technical spirit of the disclosure, including the claims and such modifications should be individually understood from the technical spirit. It will also be understood that any of the embodiment(s) described herein may be used in conjunction with any other embodiment(s) described herein.

What is claimed is:

1. An electronic device comprising,
 a housing;

a tray socket provided in the housing;
a tray configured to be inserted into the tray socket along an insertion direction; and
an ejector configured to be connected to the tray socket and configured to press and separate the tray in a separation direction opposite to the insertion direction, wherein the tray comprises:
a first body configured to detachably couple with the tray socket and including a seating portion configured to accommodate and support an external part;
a second body configured to slidably couple with the first body along the insertion direction and including a sub-seating portion configured to accommodate or support an external part;
a tray cover configured to be connected to the first body and exposed to the outside based on a state in which the tray is inserted into the tray socket and in which a pin insertion hole configured to enable communication between the second body and the outside is formed, and
wherein the second body is configured to slidably operate in the insertion direction to press the ejector based on an external force being applied through the pin insertion hole.

2. The electronic device of claim 1, wherein the seating portion passes through a top surface and a bottom surface of the first body, and
the second body overlaps at least a portion of the seating portion when viewed from a top surface of the first body.

3. The electronic device of claim 1, wherein the first body comprises a first open area surrounding at least a portion of an area adjacent to the seating portion, and
the second body is configured to couple with the first body in contact with at least a portion of the first open area.

4. The electronic device of claim 3, wherein the second body comprises a second open area formed in an area facing the seating portion to accommodate the seating portion.

5. The electronic device of claim 1, wherein the second body comprises a protrusion protruding toward the first body, and
the first body comprises a stopper configured to accommodate the protrusion and to limit a movement range of the second body.

6. The electronic device of claim 1, wherein the second body is coupled with the first body to be spaced apart from the seating portion.

7. The electronic device of claim 1, wherein the second body is provided at one of both ends of the first body parallel to the insertion direction.

8. The electronic device of claim 1, wherein a plurality of seating portions is formed in the first body, and
the second body overlaps at least a portion of at least one of the plurality of seating portions when viewed from a top surface of the first body.

9. The electronic device of claim 8, wherein the plurality of seating portions comprises a first seating portion formed on the top surface of the first body and a second seating portion formed on a bottom surface of the first body, and
the second body is configured to slide between the first seating portion and the second seating portion.

10. The electronic device of claim 1, wherein the second body comprises a first surface facing the pin insertion hole and
a second surface facing the first surface and including a pressing area configured to r press the ejector.

11. The electronic device of claim 10, wherein the pressing area protrudes in the insertion direction from the center of the second surface.

12. The electronic device of claim 10, wherein the pressing area is provided in a portion adjacent to an edge of the second surface.

13. The electronic device of claim 10, wherein the pressing area is bent at least once toward the ejector.

14. The electronic device of claim 1, wherein the ejector comprises:
a rotating shaft configured to couple with the tray socket such that the ejector is rotatable;
a first end extending in a direction in which contact the first body while the ejector rotates; and
a second end extending in a direction in which contact the second body while the ejector rotates.

15. The electronic device of claim 14, wherein, when the second body is configured to slide and press the second end, the ejector is configured to rotate such that the first end presses the first body and pushes the tray from the tray socket.

16. A tray device configured to couple with an electronic device, the tray device comprising:
a tray;
a tray socket into which the tray is configured to be inserted along an insertion direction;
an ejector configured to be connected to the tray socket and configured to press and separate the tray in a separation direction opposite to the insertion direction, wherein the tray comprises:
a first body configured to detachably couple with the tray socket, and including a seating portion configured to accommodate and support an external part;
a second body configured to be slidably coupled with the first body along the insertion direction and to overlap at least a portion of the seating portion when viewed from a top surface of the first body, and the second body including a sub-seating portion configured to accommodate or support an external part; and
a tray cover connected to the first body and exposed to the outside based on a state in which the tray is inserted into the tray socket and in which a pin insertion hole configured to enable communication between the second body and the outside is formed, and
wherein the second body is configured to slidably operate in the insertion direction to press the ejector based on an external force being applied through the pin insertion hole.

17. The tray device of claim 16, wherein the second body comprises a protrusion protruding toward the first body, and
the first body comprises a stopper configured to accommodate the protrusion and to limit a movement range of the second body.

18. The tray device of claim 16, wherein the second body comprises a first surface facing the pin insertion hole and
a second surface facing the first surface and including a pressing area configured to press the ejector.

19. The tray device of claim 16, wherein the ejector comprises:
a rotating shaft coupled with the tray socket such that the ejector is rotatable;
a first end extending in a direction in which contact the first body while the ejector rotates; and
a second end extending in a direction in which contact the second body while the ejector rotates.

20. The tray device of claim 16, wherein, when the second body is configured to slide and press the second end, the ejector is configured to rotate such that the first end presses the first body and pushes the tray from the tray socket.

* * * * *